US012777832B2

(12) United States Patent
Naoki et al.

(10) Patent No.: US 12,777,832 B2

(45) Date of Patent: Oct. 27, 2026

(54) METHOD OF MANUFACTURING SEMICONDUCTOR DEVICE INCLUDING DOUBLE PATTERNING PROCESS

(71) Applicant: SAMSUNG ELECTRONICS CO., LTD., Suwon-si (KR)

(72) Inventors: Inoue Naoki, Suwon-si (KR); Tsunehiro Nishi, Suwon-si (KR); Yonghoon Moon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 376 days.

(21) Appl. No.: 18/379,828

(22) Filed: Oct. 13, 2023

(65) Prior Publication Data

US 2024/0130212 A1 Apr. 18, 2024

(30) Foreign Application Priority Data

Oct. 14, 2022 (KR) ........................ 10-2022-0132722

(51) Int. Cl.
*H10K 71/20* (2023.01)

(52) U.S. Cl.
CPC .................................. *H10K 71/233* (2023.02)

(58) Field of Classification Search
CPC ....... H10K 71/233; G03F 7/20; H10P 50/692; H10P 76/405; H10P 76/4085; H10P 50/695
See application file for complete search history.

(56) References Cited

U.S. PATENT DOCUMENTS

| | | | |
|---|---|---|---|
| 9,443,731 B1 | 9/2016 | O'Meara et al. | |
| 9,768,025 B2 * | 9/2017 | Siew | H10P 76/4085 |
| 10,553,449 B2 | 2/2020 | Hwang et al. | |
| 10,629,435 B2 | 4/2020 | Swaminathan et al. | |

(Continued)

FOREIGN PATENT DOCUMENTS

| | | |
|---|---|---|
| KR | 10-2009-0131821 A | 12/2009 |
| WO | WO 2020/216899 A1 | 10/2020 |

OTHER PUBLICATIONS

Ishibashi et al. "Novel Spin-on Carbon Hard Mask with Hardening by Ion Implantation", Journal of Photopolymer Science and Tech, vol. 20, No. 3, 2007.

(Continued)

*Primary Examiner* — Syed I Gheyas

(74) *Attorney, Agent, or Firm* — Muir Patent Law, PLLC

(57) ABSTRACT

A method of manufacturing a semiconductor device, including forming a plurality of first organic patterns spaced apart from one another in one direction on a supporting layer, wherein the plurality of first organic patterns include ion-implanted patterns, forming a plurality of inorganic patterns on the supporting layer that are in contact with the plurality of first organic patterns and spaced apart from one other in the one direction, wherein the inorganic patterns include ion-implanted patterns, forming a plurality of second organic patterns arranged between the plurality of inorganic patterns on the supporting layer, wherein the second organic patterns include ion-implanted patterns, and selectively etching the ion-implanted inorganic patterns to form a plurality of space patterns that are arranged between the ion-implanted first organic patterns and the ion-implanted second organic patterns.

17 Claims, 30 Drawing Sheets

(56) References Cited

U.S. PATENT DOCUMENTS

| | | | | |
|---|---|---|---|---|
| 10,886,138 | B2 | 1/2021 | Yang et al. | |
| 2007/0077524 | A1 * | 4/2007 | Koh | G03F 7/40 257/E21.026 |
| 2009/0298274 | A1 * | 12/2009 | Kajiwara | H10B 41/48 438/700 |
| 2010/0144151 | A1 * | 6/2010 | Sills | G03F 7/40 438/694 |
| 2019/0295846 | A1 * | 9/2019 | Clark | H10P 76/4085 |
| 2019/0355588 | A1 * | 11/2019 | Yang | H10P 50/283 |
| 2021/0202243 | A1 | 7/2021 | Sarkar et al. | |

OTHER PUBLICATIONS

Bencher et al., Proc. of the SPIE, vol. 6924, 69244E-1 (2008).
Kim et al., Proc. of SPIE, vol. 9777, 97771B-1 (2016).

* cited by examiner

METHOD OF MANUFACTURING SEMICONDUCTOR DEVICE INCLUDING DOUBLE PATTERNING PROCESS

CROSS-REFERENCE TO RELATED APPLICATION

Korean Patent Application No. 10-2022-0132722, filed on Oct. 14, 2022, in the Korean Intellectual Property Office, is incorporated by reference herein in its entirety.

BACKGROUND

1. Field

A method of manufacturing a semiconductor device, particularly, a method of manufacturing a semiconductor device including a double patterning process is disclosed.

2. Description of the Related Art

As semiconductor devices are highly integrated, a critical dimension (CD) of patterns formed on a semiconductor substrate may decrease.

SUMMARY

Embodiments are directed to a method of manufacturing a semiconductor device including forming a plurality of first organic patterns spaced apart from one another in one direction on a supporting layer, the plurality of first organic patterns include ion-implanted patterns, forming a plurality of inorganic patterns on the supporting layer that are in contact with the plurality of first organic patterns and spaced apart from one other in the one direction, the inorganic patterns include ion-implanted patterns, and forming a plurality of second organic patterns arranged between the plurality of inorganic patterns on the supporting layer, the second organic patterns include ion-implanted patterns, and selectively etching the ion-implanted inorganic patterns to form a plurality of space patterns that are arranged between the ion-implanted first organic patterns and the ion-implanted second organic patterns.

Embodiments are also directed to a method of manufacturing a semiconductor device including forming a plurality of first organic patterns spaced apart from one another in one direction on a supporting layer, forming a plurality of inorganic patterns on both sidewalls of the first organic patterns, forming a second organic layer between the plurality of inorganic patterns while covering the plurality of first organic patterns and the plurality of inorganic patterns, implanting ions into all of the second organic layer, the plurality of first organic patterns, and the plurality of inorganic patterns, forming ion-implanted second organic patterns, ion-implanted first organic patterns, and ion-implanted inorganic patterns by etching back the ion-implanted second organic layer, the ion-implanted inorganic patterns are in contact with the ion-implanted first organic patterns and apart from one another in the one direction and the ion-implanted second organic patterns are arranged between the ion-implanted inorganic patterns, and selectively etching the ion-implanted inorganic patterns to form a plurality of space patterns that are arranged between the ion-implanted first organic patterns and the ion-implanted second organic patterns.

Embodiments are also directed to a method of manufacturing a semiconductor device including forming a plurality of first organic patterns spaced apart from one another in one direction on a supporting layer, forming a plurality of inorganic patterns on both sidewalls of the first organic patterns, forming a second organic layer between the plurality of inorganic patterns while covering the plurality of first organic patterns and the plurality of inorganic patterns, forming second organic patterns by etching back the second organic layer, the plurality of inorganic patterns are in contact with the plurality of first organic patterns and apart from one another in the one direction and the second organic patterns are arranged between the plurality of inorganic patterns, forming ion-implanted second organic patterns, ion-implanted first organic patterns, and ion-implanted inorganic patterns by implanting ions into all of the second organic patterns, the plurality of first organic patterns, and the plurality of inorganic patterns, and selectively etching the ion-implanted inorganic patterns to form a plurality of space patterns that are arranged between the ion-implanted first organic patterns and the ion-implanted second organic patterns.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
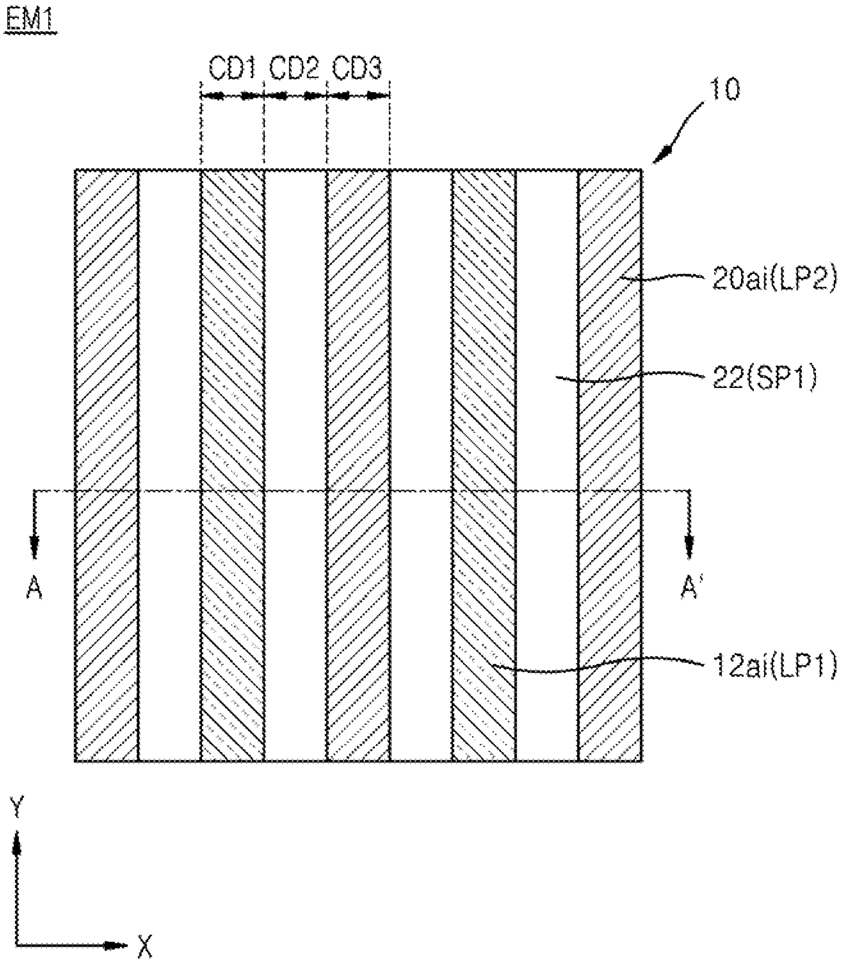
FIG. 1 is a plan view of a semiconductor device according to an example embodiment.
Figure 2:
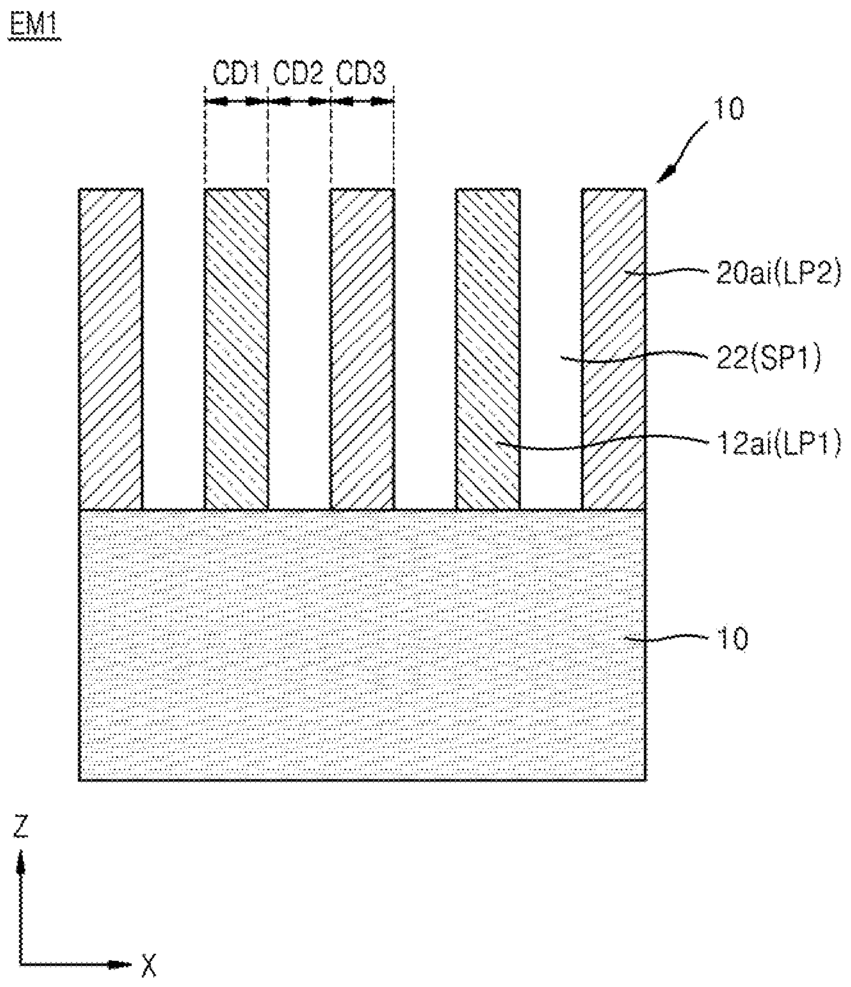
FIG. 2 is a cross-sectional view taken along a line A-A' in FIG. 1.

FIG. 1 is a cross-sectional view of a semiconductor device according to an example embodiment, and FIG. 2 is a cross-sectional view obtained along a line A-A' of FIG. 1.

A semiconductor device EM1 may include ion-implanted first organic patterns 12*ai*, ion-implanted second organic patterns 20*ai*, and space patterns 22 that may be arranged on a supporting layer 10.

The ion-implanted first organic patterns 12*ai*, the ion-implanted second organic patterns 20*ai*, and the space patterns 22 may be, as described later, formed through a double patterning process, that is, a self-aligned double patterning process.

The supporting layer 10 may be a substrate. The substrate may include a semiconductor like silicon Si or Ge or a compound semiconductor like SiGe, SiC, GaAs, InAs, or InP. According to some embodiments, the substrate may include a group III-V material or a group IV material. As used herein, the term “or” is not an exclusive term, e.g., “A or B” would include A, B, or A and B.

The group III-V material may be a compound including In, Ga, or Al as a group III element and As, P, or Sb as a group V element. The group IV material may be Si or Ge. According to some embodiments, the substrate may have a silicon on insulator (SOI) structure.

The ion-implanted first organic patterns 12*ai* may be a plurality of patterns spaced apart from one another in a first direction (X direction) on the supporting layer 10. The ion-implanted first organic patterns 12*ai* may have a first critical dimension CD1 in the first direction (X direction). According to some embodiments, the first critical dimension CD1 may be 20 nm or less. According to some embodiments, the first critical dimension CD1 may be from about 2 nm to about 20 nm.

As shown in FIG. 1, the ion-implanted first organic patterns 12*ai* may be patterns extending in a second direction (Y direction) perpendicular to the first direction (X direction). As shown in FIG. 1, the ion-implanted first organic patterns 12*ai* may be patterns extending in a third direction (Z direction) vertically perpendicular to the first direction (X direction).

As shown in FIG. 1, the ion-implanted first organic patterns 12*ai* may be first linear patterns LP1 in a plan view. Although FIGS. 1 and 2 show only two ion-implanted first organic patterns 12*ai* for convenience, more ion-implanted first organic patterns 12*ai* may be arranged in the first direction (X direction).

The ion-implanted second organic patterns 20*ai* may be spaced apart from the ion-implanted first organic patterns 12*ai* by the space patterns 22 in the first direction (X direction). The ion-implanted second organic patterns 20*ai* may be a plurality of patterns spaced apart from one another in the first direction (X direction) on the supporting layer 10. As shown in FIG. 1, the ion-implanted second organic patterns 20*ai* may be patterns extending in the third direction (Z direction) vertically perpendicular to the first direction (X direction).

The ion-implanted second organic patterns 20*ai* may have a third critical dimension CD3 in the first direction (X direction). According to some embodiments, the third critical dimension CD3 may be 20 nm or less. According to some embodiments, the third critical dimension CD3 may be from about 2 nm to about 20 nm.

As shown in FIG. 1, the ion-implanted second organic patterns 20*ai* may be patterns extending in the second direction (Y direction) perpendicular to the first direction (X direction). As shown in FIG. 1, the ion-implanted second organic patterns 20*ai* may be patterns extending in the third direction (Z direction) vertically perpendicular to the first direction (X direction).

As shown in FIG. 1, the ion-implanted second organic patterns 20*ai* may be second linear patterns LP2 in a plan view. Although FIGS. 1 and 2 show only three ion-implanted second organic patterns 20*ai* for convenience, more ion-implanted second organic patterns 20*ai* may be arranged in the first direction (X direction).

The space patterns 22 may be arranged between the ion-implanted first organic patterns 12*ai* and the ion-implanted second organic patterns 20*ai*. The space patterns 22 may be a plurality of patterns spaced apart from one another in the first direction (X direction) on the supporting layer 10.

The space patterns 22 may have a second critical dimension CD2 in the first direction (X direction). According to some embodiments, the second critical dimension CD2 may be 20 nm or less. According to some embodiments, the second critical dimension CD2 may be from about 2 nm to about 20 nm.

As shown in FIG. 1, the space patterns 22 may be patterns extending in the second direction (Y direction) perpendicular to the first direction (X direction). As shown in FIG. 1, the space patterns 22 may be linear space patterns SP1 in a plan view. Although FIGS. 1 and 2 show only four space patterns 22 for convenience, more space patterns 22 may be arranged in the first direction (X direction).

According to some embodiments, the first critical dimension CD1 of the ion-implanted first organic patterns 12*ai*, the second critical dimension CD2 of the ion-implanted second organic patterns 20*ai*, and the third critical dimension CD3 of the space patterns 22 may be equal to one another.

According to some embodiments, the first critical dimension CD1 of the ion-implanted first organic patterns 12*ai*, the second critical dimension CD2 of the ion-implanted second organic patterns 20*ai*, and the third critical dimension CD3 of the space patterns 22 may be different from one another.

According to some embodiments, the ion-implanted first organic patterns 12*ai* and the ion-implanted second organic patterns 20*ai* may include the same organic material. According to some embodiments, the ion-implanted first organic patterns 12*ai* and the ion-implanted second organic patterns 20*ai* may include different organic materials.

According to some embodiments, the ion-implanted first organic patterns 12*ai* and the ion-implanted second organic patterns 20*ai* may include a spin on hard mask (SOH) material. Here, an SOH material may refer to a material including a hydrocarbon compound having a relatively high carbon content from about 85 wt % to about 99 wt % with respect to the total weight or a derivative thereof.

According to some embodiments, the ion-implanted first organic patterns 12*ai* and the ion-implanted second organic patterns 20*ai* may include an amorphous carbon layer (ACL) material or a photoresist material instead of an SOH material. An ACL material or a photoresist material may also contain a large amount of carbon, and thus the ACL material or the photoresist material may have properties similar to those of an SOH material.

FIGS. 3 to 12 are cross-sectional views for describing a method of manufacturing a semiconductor device according to an example embodiment.

Figure 3:
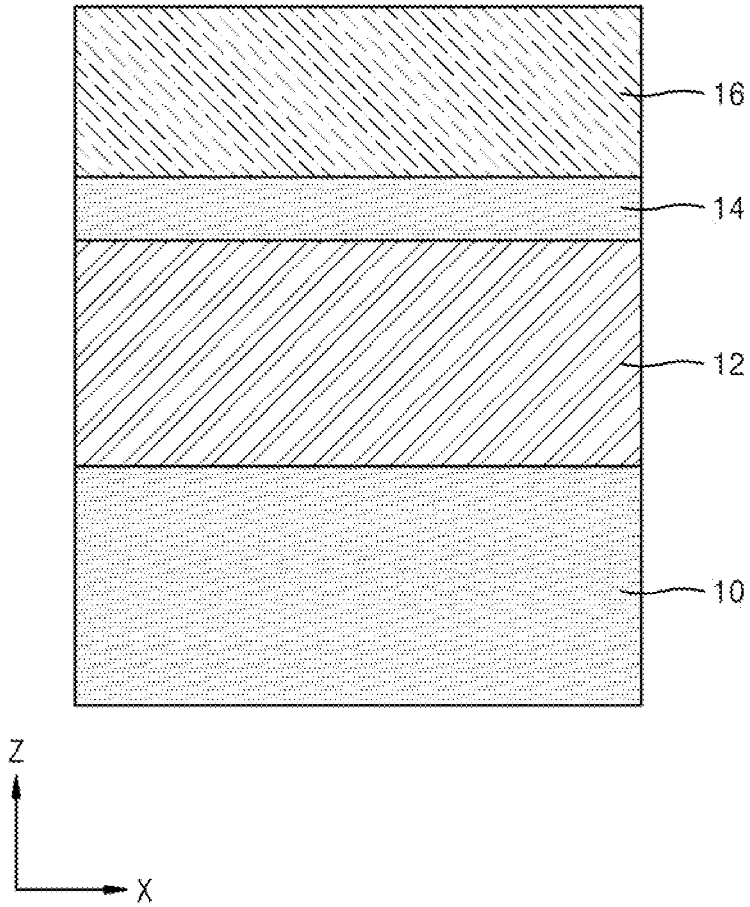
FIGS. 3 to 12 are cross-sectional views for describing a method of manufacturing a semiconductor device according to an example embodiment.

FIGS. 3 to 12 are provided to describe a method of manufacturing the semiconductor device EM1 of FIGS. 1 and 2. Referring to FIG. 3, a first organic layer 12, a hard mask layer 14, and a photoresist layer 16 may be sequentially formed on the supporting layer 10.

The supporting layer 10 may be a substrate, e.g., a silicon substrate. The hard mask layer 14 may include a silicon hard mask layer. The hard mask layer 14 and the photoresist layer 16 are provided for patterning the first organic layer 12.

The first organic layer 12 may be formed using an SOH material, an ACL material, or a photoresist material. Here, a case of forming the first organic layer 12 using an SOH material is described as an example.

The first organic layer 12 including an SOH material may be formed by applying an organic compound through a spin coating process or another deposition process to form an organic compound layer and then performing at least one baking process.

The organic compound may include a hydrocarbon compound including an aromatic ring like phenyl, benzene, or naphthalene or a derivative thereof. Also, the organic compound may include a material having a relatively high carbon content from about 85 wt % to about 99% wt % with respect to the total weight.

First, the organic compound layer may be formed on the supporting layer 10 by applying the organic compound through a technique like spin coating. Next, a carbon-containing layer may be formed by first baking the organic compound layer at a temperature from about 150° C. to about 350° C. The first baking may be performed for about 60 seconds. Thereafter, the carbon-containing layer may be second baked at a temperature from about 300° C. to about 550° C. and cured, thereby forming the first organic layer 12 which may include an SOH material. The second baking may be performed for from about 30 seconds to about 300 seconds.

Figure 4:
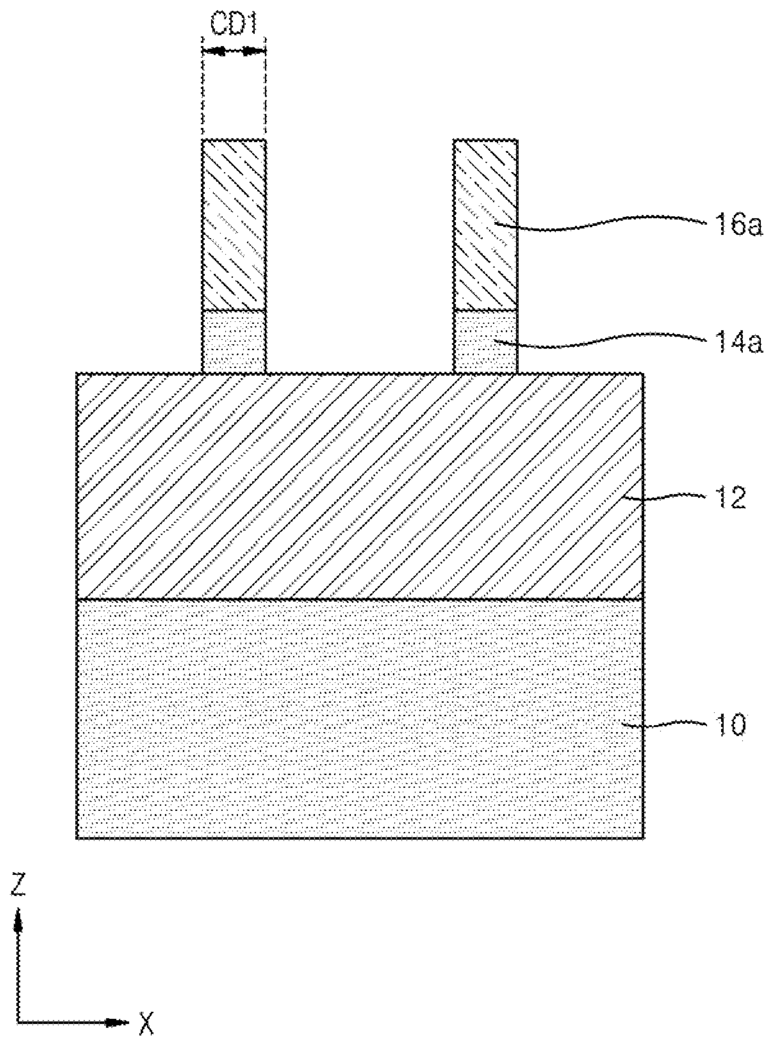
Figure 5:
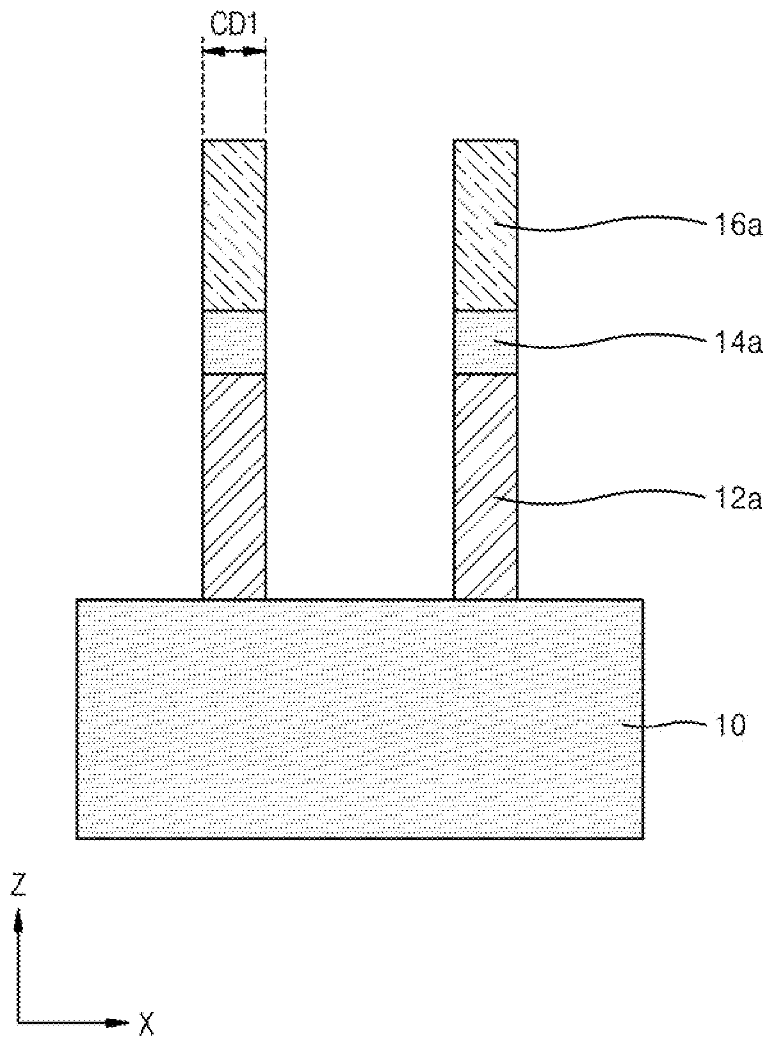

Referring to FIGS. 4 and 5, as shown in FIG. 4, hard mask patterns 14*a* and photoresist patterns 16*a* may be formed on the first organic layer 12. The photoresist patterns 16*a* may be formed by using a photolithography device.

The hard mask patterns 14*a* may be formed by etching the hard mask layer 14 using the photoresist patterns 16*a* as an etching mask. The hard mask patterns 14*a* and the photoresist patterns 16*a* may each have the first critical dimension CD1 in the first direction (X direction). According to some embodiments, the first critical dimension CD1 may be 20 nm or less. According to some embodiments, the first critical dimension CD1 may be from about 2 nm to about 20 nm.

As shown in FIG. 5, a plurality of first organic patterns 12*a* may be formed by etching the first organic layer 12 using the hard mask patterns 14*a* and the photoresist patterns 16*a* as an etching mask. The first organic patterns 12*a* may be spaced apart from one another in the first direction (X direction) on the supporting layer 10.

As described above, the first organic patterns 12*a* may be formed by first patterning the first organic layer 12. The first organic patterns 12*a* may have the first critical dimension CD1 like the hard mask patterns 14*a* and the photoresist patterns 16*a*.

Figure 6:
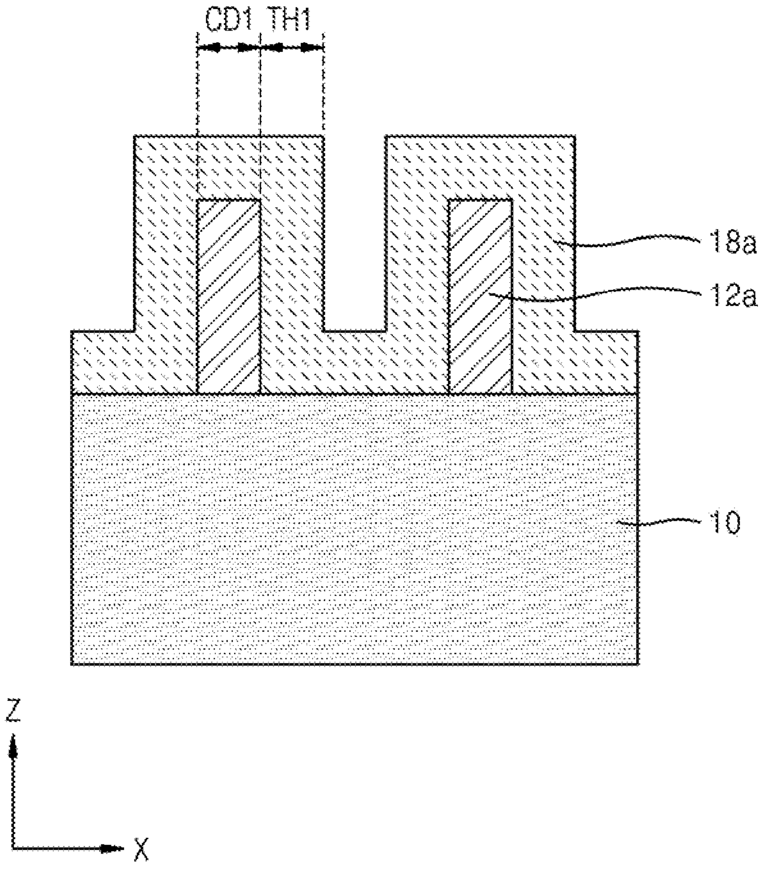

Referring to FIG. 6, the hard mask patterns 14*a* and the photoresist patterns 16*a* may be removed. The hard mask patterns 14*a* and the photoresist patterns 16*a* may be removed through a wet etching process.

Subsequently, an inorganic layer 18 may be formed on the supporting layer 10 to cover the first organic patterns 12*a*. The inorganic layer 18 may be formed on both sidewalls and the top surface of the first organic patterns 12*a* and on the supporting layer 10. The inorganic layer 18 may be formed to have a first thickness TH1.

The inorganic layer 18 may be formed to the first thickness TH1 on both sidewalls of the first organic patterns 12*a*. The first thickness TH1 may be from several nm to dozens of nm. The inorganic layer 18 may be formed on both sidewalls of the first organic patterns 12*a* to not to fill spaces between the first organic patterns 12*a*.

According to some embodiments, the inorganic layer 18 may include an oxide layer. According to some embodiments, the inorganic layer 18 may include a silicon oxide layer. The inorganic layer 18 may be formed through chemical vapor deposition or atomic layer deposition.

Figure 7:
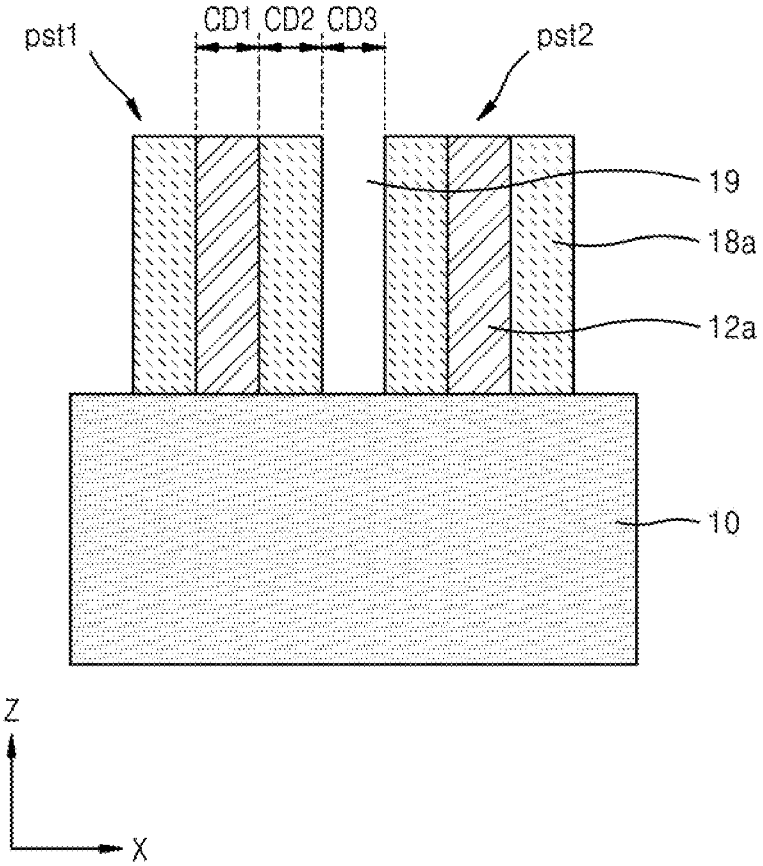

Referring to FIG. 7, a plurality of inorganic patterns 18*a* may be formed by etching back the inorganic layer 18. The inorganic layer 18 may be formed on the top surfaces of the first organic patterns 12*a* and the inorganic layer 18 may be formed on the top surface of the supporting layer 10, and may be removed through etchback. The inorganic patterns 18*a* may be formed by secondarily patterning the inorganic layer 18 through an etch-back process.

The inorganic patterns 18*a* may contact sidewalls of the first organic patterns 12*a* and may be spaced apart from one another in the first direction (X direction). The inorganic patterns 18*a* may be formed to be self-aligned to the first organic patterns 12*a*. The inorganic patterns 18*a* may also be referred to as inorganic spacer patterns.

The inorganic patterns 18*a* may have the second critical dimension CD2 in the first direction (X direction). The second critical dimension CD2 may be determined according to the first thickness TH1 of the inorganic layer 18. The second critical dimension CD2 may be the same as the first critical dimension CD1. According to some embodiments, the second critical dimension CD2 may be 20 nm or less. According to some embodiments, the second critical dimension CD2 may be from about 2 nm to about 20 nm.

As the inorganic layer 18 is etched back, first openings 19 may be formed between the inorganic patterns 18*a*. The first openings 19 may be formed to be self-aligned to the inorganic patterns 18*a*. A first opening 19 may have the third critical dimension CD3 in the first direction (X direction). The third critical dimension CD3 may be the same as the first critical dimension CD1 and the second critical dimension CD2. According to some embodiments, the third critical dimension CD3 may be 20 nm or less. According to some embodiments, the third critical dimension CD3 may be from about 2 nm to about 20 nm.

As the inorganic layer 18 is etched back, a first pattern structure pst1 including one first organic pattern 12*a* and two inorganic patterns 18*a* formed on both sidewalls of the first organic pattern 12*a* may be formed. As the inorganic layer 18 is etched back, a second pattern structure pst2 may be formed apart from the first pattern structure pst1 in the first direction (X direction).

The second pattern structure pst2 may include one first organic pattern 12*a* and two inorganic patterns 18*a* formed on both sidewalls of the first organic pattern 12*a*. The first opening 19 may be formed between the first pattern structure pst1 and the second pattern structure pst2.

Figure 8:
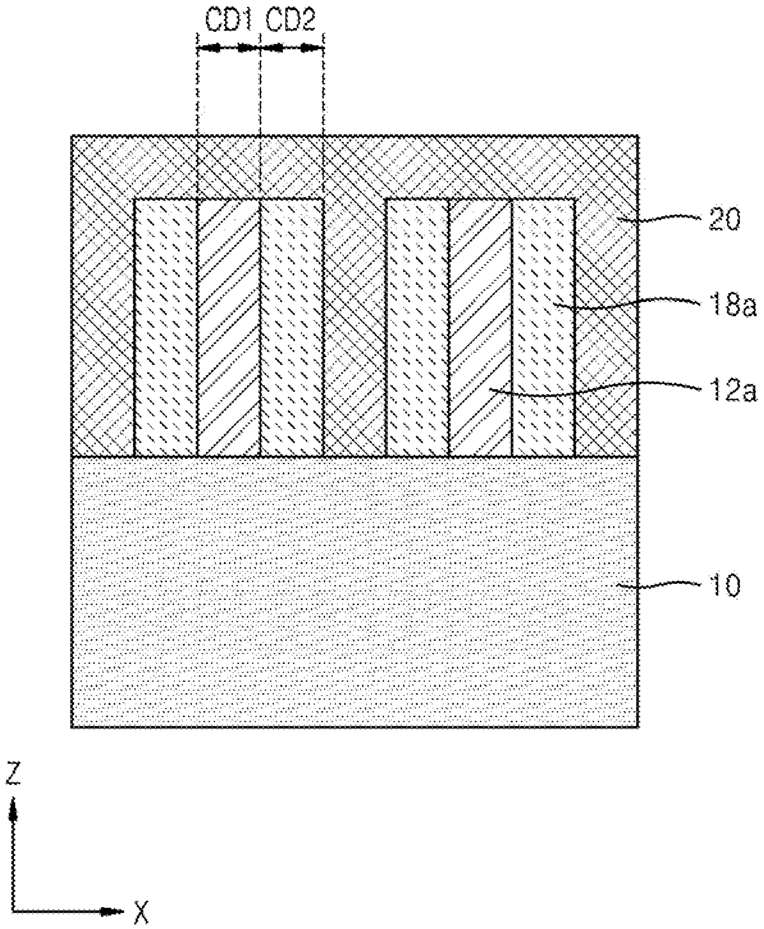

Referring to FIG. 8, a second organic layer 20 may be formed to fill the space between the inorganic patterns 18*a* while covering the first organic patterns 12*a* and the inorganic patterns 18*a*. The second organic layer 20 may be formed on the first pattern structure pst1 and the second pattern structure pst2 to fill the first opening 19.

The second organic layer 20 may be formed using an SOH material, an ACL material, or a photoresist material. The second organic layer 20 may include a material that is the same as or different from the material constituting the first organic layer 12.

Figure 9:
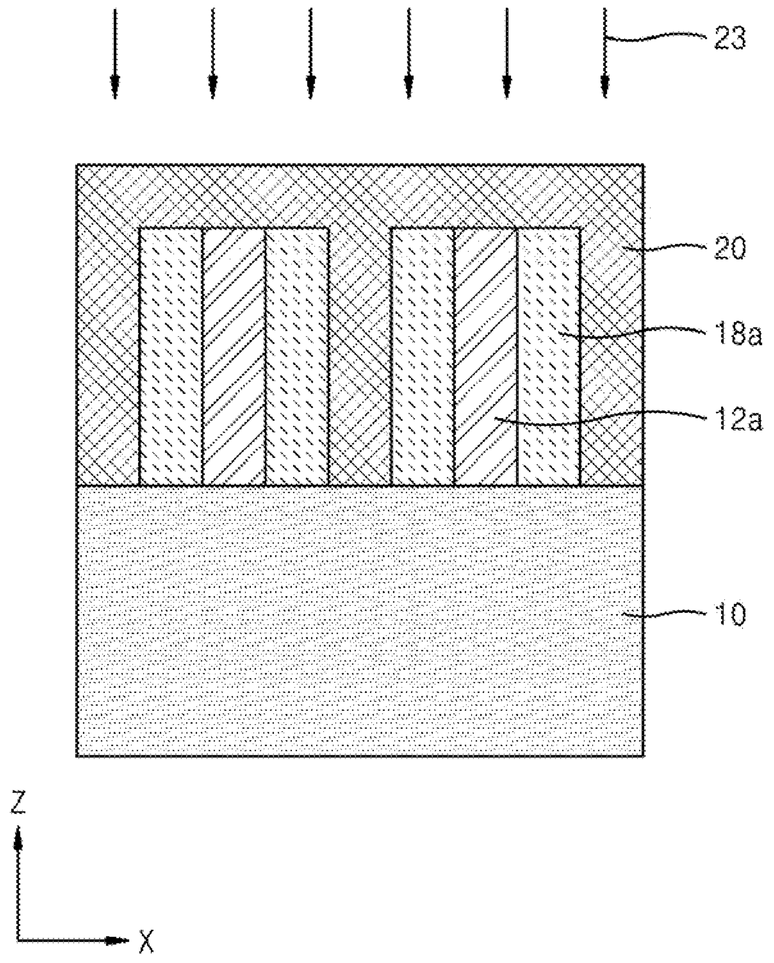
Figure 10:
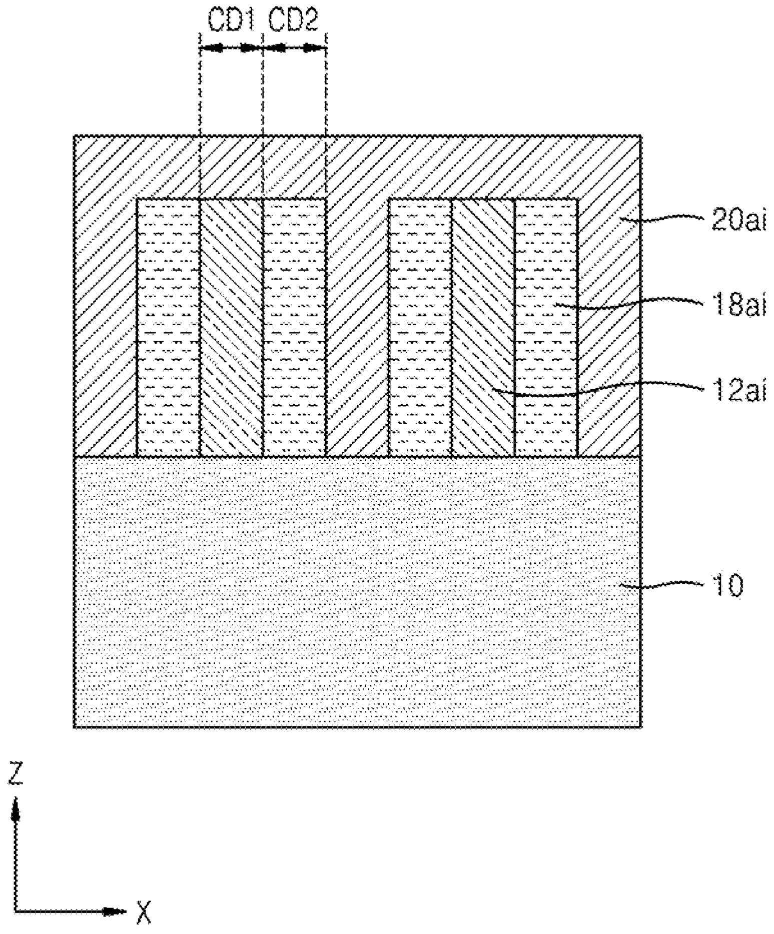

Referring to FIGS. 9 and 10, as shown in FIG. 9, an ion implantation process of implanting ions 23 into the entire top surface of the second organic layer 20 may be performed. The ion implantation process may be referred to as an ion doping process. The ions 23 may be inactive ions, e.g., argon ions (Ar+). The ions 23 may be implanted into all of the second organic layer 20, the first organic patterns 12*a*, and the inorganic patterns 18*a*.

According to some embodiments, the ions 23, i.e., argon ions, may be implanted into all of the second organic layer 20, the first organic patterns 12*a*, and the inorganic patterns 18*a* at a dose amount of about 1E16 ions/$cm^2$ and an energy from about 10 keV to about 500 keV.

As shown in FIG. 10, as the ions 23 are implanted, the second organic layer 20, the first organic patterns 12*a*, and the inorganic patterns 18*a* may become an ion-implanted second organic layer 20*i*, the ion-implanted first organic patterns 12*ai*, and ion-implanted inorganic patterns 18*ai*, respectively. The ion-implanted first organic patterns 12*ai* may have the first critical dimension CD1. The ion-implanted inorganic patterns 18*ai* may have the second critical dimension CD2.

As described below, the ion-implanted second organic layer 20*i* and the ion-implanted first organic patterns 12*ai* may exhibit reduced etching rates with respect to an etching gas, whereas the ion-implanted inorganic patterns 18*ai* may exhibit an increased etching rate with respect to the etching gas.

Figure 11:
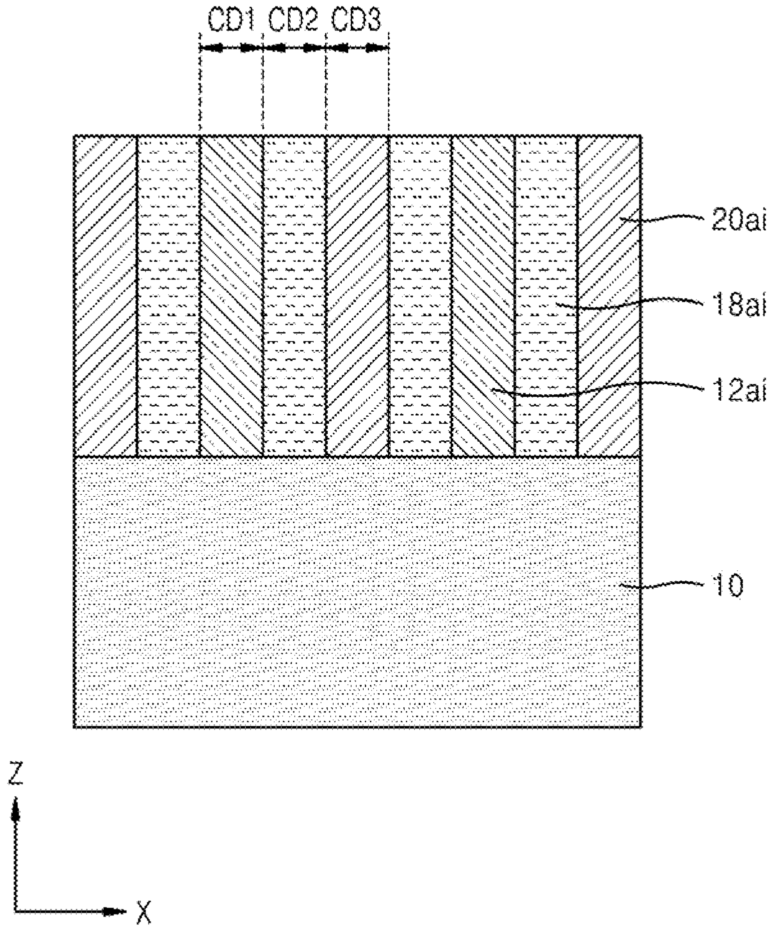

Referring to FIG. 11, a plurality of ion-implanted second organic patterns 20*ai* may be formed by etching back the ion-implanted second organic layer 20*i*. The ion-implanted second organic layer 20*i* may be formed on the top surfaces of the ion-implanted first organic patterns 12*ai* and the ion-implanted inorganic patterns 18*ai* may be removed through etchback.

The ion-implanted second organic patterns 20*ai* may be formed between the ion-implanted inorganic patterns 18*ai* and may be spaced apart from one another in the first direction (X direction). The ion-implanted second organic patterns 20*ai* may have the third critical dimension CD3 in the first direction (X direction).

The third critical dimension CD3 of the ion-implanted second organic patterns 20*ai* may be the same as the first critical dimension CD1 and the second critical dimension CD2. According to some embodiments, the third critical dimension CD3 of the ion-implanted second organic patterns 20*ai* may be 20 nm or less. According to some embodiments, the third critical dimension CD3 of the ion-implanted second organic patterns 20*ai* may be from about 2 nm to about 20 nm.

Figure 12:
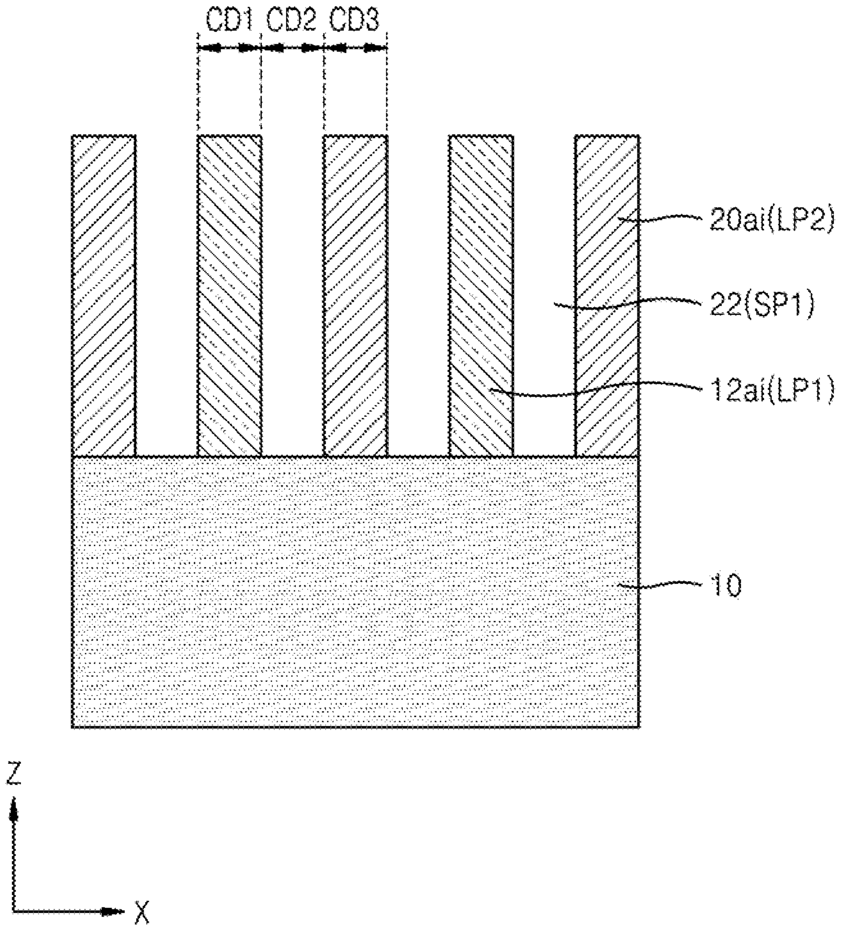

Referring to FIG. 12, the ion-implanted inorganic patterns 18*ai* on the supporting layer 10 are selectively etched and removed. The ion-implanted inorganic patterns 18*ai* may be selectively removed using a dry etching method, i.e., a plasma etching method. The ion-implanted inorganic patterns 18*ai* may be etched using an etching gas, e.g., a $CF_4/H_2$ gas, a $CHF_3$ gas, or a $C_2F_6$ gas.

As described below, etching rates of the ion-implanted second organic patterns 20*ai* and the ion-implanted first organic patterns 12*ai* to which ions are implanted through an ion implantation process may be reduced. The inorganic patterns 18*ai* to which ions are implanted through an ion implantation process may exhibit an increased etching rate with respect to the etching gas.

In other words, the etch selectivity of the ion-implanted inorganic patterns 18*ai* with respect to both the ion-implanted second organic patterns 20*ai* and the ion-implanted first organic patterns 12*ai* may become as high as about 10 or higher. Therefore, the ion-implanted inorganic patterns 18*ai* may be selectively and easily etched and removed without damaging the ion-implanted second organic patterns 20*ai* and the ion-implanted first organic patterns 12*ai* on the supporting layer 10.

In particular, when the etch selectivity of the ion-implanted inorganic patterns 18*ai* in FIG. 11 with respect to both the ion-implanted second organic patterns 20*ai* and the ion-implanted first organic patterns 12*ai* is high, the critical dimensions of the ion-implanted second organic patterns 20*ai* and the ion-implanted first organic patterns 12*ai* may not be changed, and the roughness of side surfaces of the ion-implanted second organic patterns 20*ai* and the ion-implanted first organic patterns 12*ai* may be reduced.

Also, regarding the above-stated etching gas, an etch selectivity of the ion-implanted inorganic patterns 18*ai* with respect to the supporting layer 10 (i.e., the substrate) exposed after the ion-implanted inorganic patterns 18*ai* are etched may also be as large as 10 or higher. Therefore, the ion-implanted inorganic patterns 18*ai* may be selectively removed without damaging the supporting layer 10 (i.e., the substrate).

As the ion-implanted inorganic patterns 18*ai* are removed, as described in FIGS. 1 and 2, the ion-implanted first organic patterns 12*ai* and the ion-implanted second organic patterns 20*ai* may become the first linear patterns LP1 and the second linear patterns LP2, respectively.

As the ion-implanted inorganic patterns 18*ai* are removed, the plurality of space patterns 22 may be formed between the ion-implanted first organic patterns 12*ai* and the ion-implanted second organic patterns 20*ai*. The space patterns 22 may be linear space patterns SP1 as described above in FIGS. 1 and 2.

The space patterns 22 may have the second critical dimension CD2 in the first direction (X direction). According to some embodiments, the second critical dimension CD2 of the space patterns 22 may be 20 nm or less. According to some embodiments, the second critical dimension CD2 of the space patterns 22 may be from about 2 nm to about 20 nm.

As described above, according to the method of manufacturing a semiconductor device, the etch selectivity between patterns may be used to remove the ion-implanted inorganic patterns 18*ai* and leave the ion-implanted first organic patterns 12*ai* and the ion-implanted first organic patterns 12*ai*.

As described above, according to the method of manufacturing a semiconductor device, the ion-implanted first organic patterns 12*ai*, the ion-implanted second organic patterns 20*ai*, and the space patterns 22 may be easily formed through a double patterning process, that is, a self-aligned double patterning process.

Figure 13:
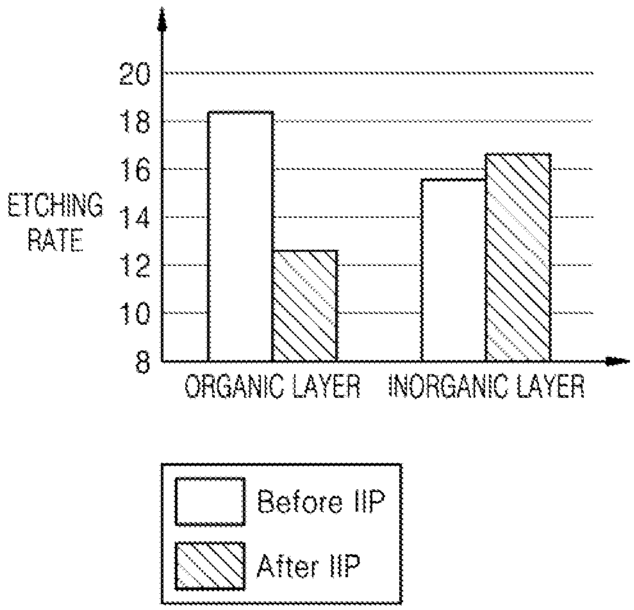
FIG. 13 is a diagram showing changes in etching rates of an organic layer and an inorganic layer before and after ion implantation according to an example embodiment.

FIG. 13 is a diagram showing changes in etching rates of an organic layer and an inorganic layer before and after ion implantation according to an example embodiment.

The bar graph on the left of FIG. 13 shows changes in etching rates of organic layers (the first organic patterns 12*a* and the second organic layer 20 of FIG. 8) before ion implantation and etching rates of organic layers (the ion-implanted first organic patterns 12*ai* and the ion-implanted second organic patterns 20*ai* of FIG. 11) after ion implantation. The etching rate may indicate an etch thickness (A) per second (sec). The etching rate may relate to an etching gas for etching the ion-implanted inorganic patterns 18*ai* described above. As shown in the bar graph on the left of FIG. 13, the etching rate of the organic layers (the ion-implanted first organic patterns 12*ai* and the ion-implanted second organic patterns 20*ai* of FIG. 11) after ion implantation may be less than that of the organic layers (the first organic patterns 12*a* and the second organic layer 20 of FIG. 8) before ion implantation.

The bar graph on the right of FIG. 13 shows the changes in etching rates of the inorganic layer before ion implantation (the inorganic patterns 18*a* of FIG. 8) and the inorganic layer after ion implantation (the ion-implanted inorganic patterns 18*ai* of FIG. 11). The etching rate may relate to an etching gas for etching the ion-implanted inorganic patterns 18*ai* described above. As shown in the bar graph on the right of FIG. 13, the etching rate of the inorganic layers (the ion-implanted inorganic patterns 18*ai* of FIG. 11) may be greater than that of the inorganic layers before ion implantation (the inorganic patterns 18*a* of FIG. 8).

As shown in FIG. 13, the etching rate of the organic layer after ion implantation (the ion-implanted first organic patterns 12*ai* and the ion-implanted second organic patterns 20*ai* of FIG. 11) may decrease, whereas the etching rate of the inorganic layer after ion implantation (the ion-implanted organic patterns 18*ai* of FIG. 11) may increase. Therefore, as described above with reference to FIGS. 11 and 12, the ion-implanted inorganic patterns (the ion-implanted inorganic patterns 18*ai* of FIG. 11) may be selectively and easily etched and removed without damaging the ion-implanted second organic patterns 20*ai* and the ion-implanted first organic patterns 12*ai*.

Figure 14:
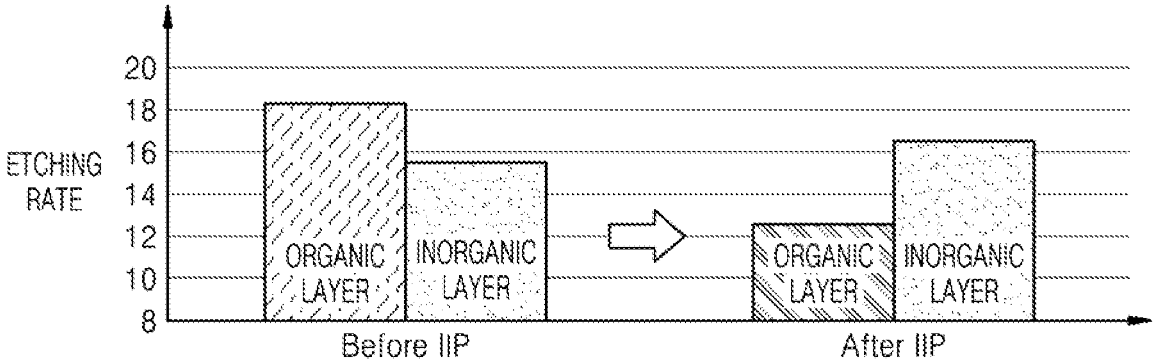
FIG. 14 is a diagram for describing a difference in etching rate between an organic layer and an inorganic layer before ion implantation and a difference in etching rate between an organic layer and an inorganic layer after ion implantation, according to an example embodiment.

FIG. 14 is a diagram for describing a difference in etching rate between an organic layer and an inorganic layer before ion implantation and a difference in etching rate between an organic layer and an inorganic layer after ion implantation, according to an example embodiment.

Specifically, the bar graph on the left of FIG. 14 shows a difference in etching rates between an organic layer before ion implantation (the first organic patterns 12*a* and the second organic layer 20 of FIG. 8) and an inorganic layer before ion implantation (the inorganic patterns 18*a* of FIG. 8). The etching rate may indicate an etch thickness (A) per second (sec). The etching rate may relate to an etching gas for etching the ion-implanted inorganic patterns 18*ai* of FIG. 11 described above. As shown in the bar graph on the left of FIG. 14, a difference in etching rate between an organic layer before ion implantation (the first organic patterns 12*a* and the second organic layer 20 of FIG. 8) and an inorganic layer before ion implantation (the inorganic patterns 18*a* of FIG. 8) may be about 2 A/sec, which is not significant.

The bar graph on the right of FIG. 14 shows a difference in etching rates between an organic layer after ion implantation (the ion-implanted first organic patterns 12*ai* and the implanted second organic patterns 20*ai* of FIG. 11) and an inorganic layer after ion implantation the ion-implanted inorganic patterns 18*ai* of FIG. 11). The etching rate may relate to an etching gas for etching the ion-implanted inorganic patterns 18*ai* of FIG. 11 described above. As shown in the bar graph on the right of FIG. 14, a difference in etching rate between the organic layer after ion implantation (the ion-implanted first organic patterns 12*ai* and the ion-implanted second organic patterns 20*ai* of FIG. 11) and the inorganic layer after ion implantation (the ion-implanted inorganic patterns 18*ai* of FIG. 11) may be about 4 A/sec, which may be greater than that before ion implantation.

Therefore, as described above with reference to FIGS. 11 and 12, the ion-implanted inorganic patterns 18*ai* of FIG. 11 may be selectively and easily etched and removed without damaging the ion-implanted second organic patterns 20*ai* and the ion-implanted first organic patterns 12*ai*.

Figure 15:
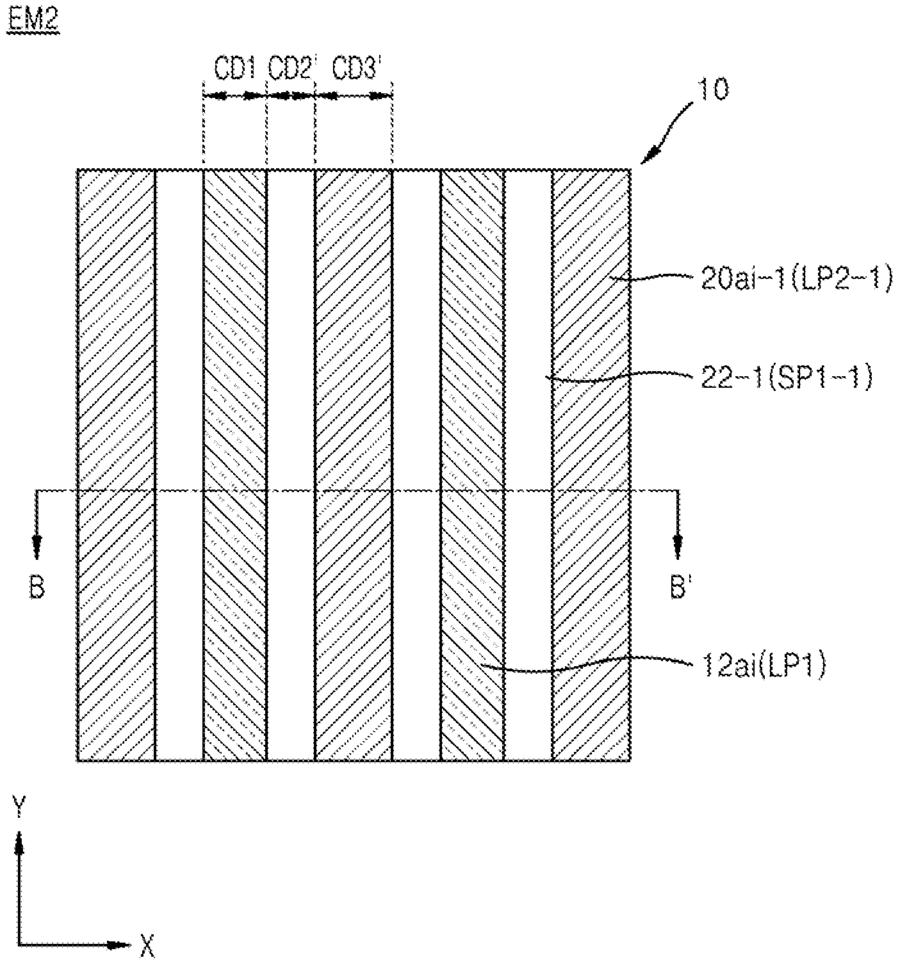
FIG. 15 is a plan view of a semiconductor device according to an example embodiment.
Figure 16:
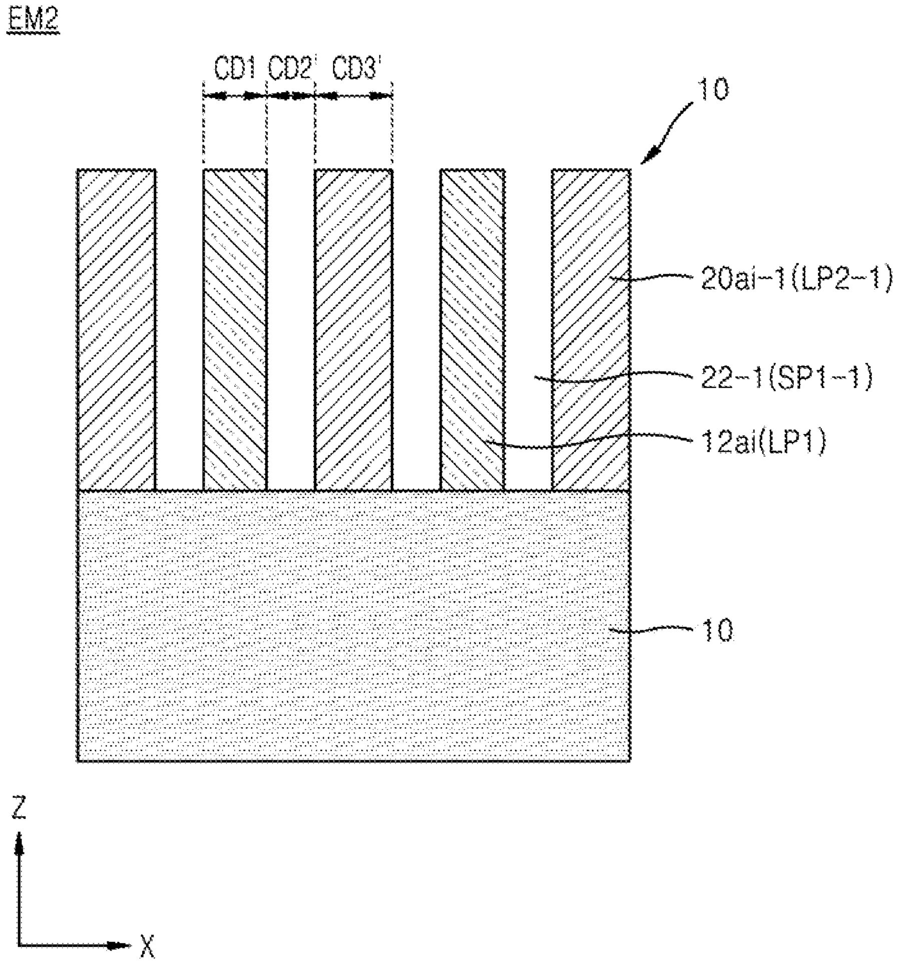
FIG. 16 is a cross-sectional view taken along a line B-B' of FIG. 15.

FIG. 15 is a plan view of a semiconductor device according to an example embodiment, and FIG. 16 is a cross-sectional view obtained along a line B-B' of FIG. 15.

A semiconductor device EM2 may be identical to the semiconductor device EM1 of FIGS. 1 and 2, except for critical dimensions of space patterns 22-1 and ion-implanted second organic patterns 20*ai*-1. In FIGS. 15 and 16, descriptions identical to those given above with reference to FIGS. 1 and 2 are briefly given or omitted.

The semiconductor device EM2 may include the ion-implanted first organic patterns 12*ai*, the ion-implanted second organic patterns 20*ai*-1, and the space patterns 22-1 that may be arranged on the supporting layer 10.

The ion-implanted first organic patterns 12*ai* may be a plurality of patterns spaced apart from one another in a first direction (X direction) on the supporting layer 10. As shown in FIG. 15, the ion-implanted first organic patterns 12*ai* may be first linear patterns LP1 in a plan view. As shown in FIG. 16, the ion-implanted first organic patterns 12*ai* may be patterns extending in the third direction (Z direction) vertically perpendicular to the first direction (X direction).

The ion-implanted first organic patterns 12*ai* may have the first critical dimension CD1 in the first direction (X direction). According to some embodiments, the first critical dimension CD1 may be 20 nm or less. According to some embodiments, the first critical dimension CD1 may be from about 2 nm to about 20 nm.

The ion-implanted second organic patterns 20*ai*-1 may be spaced apart from the ion-implanted first organic patterns 12*ai* by the space patterns 22-1 in the first direction (X direction). As shown in FIG. 15, the ion-implanted second organic patterns 20*ai*-1 may be second linear patterns LP2-1 in a plan view. As shown in FIG. 16, the ion-implanted second organic patterns 20*ai*-1 may be patterns extending in the third direction (Z direction) vertically perpendicular to the first direction (X direction).

The ion-implanted second organic patterns 20*ai*-1 may have a third critical dimension CD3' in the first direction (X direction). The third critical dimension CD3' may be greater than the first critical dimension CD1. According to some embodiments, the third critical dimension CD3' may be 20 nm or less. According to some embodiments, the third critical dimension CD3' may be from about 2 nm to about 20 nm.

The space patterns 22-1 may be arranged between the ion-implanted first organic patterns 12*ai* and the ion-implanted second organic patterns 20*ai*-1. As shown in FIG. 1, the space patterns 22-1 may be linear space patterns SP1-1 in a plan view. The space patterns 22-1 may have a second critical dimension CDT in the first direction (X direction). The second critical dimension CDT may be less than the first critical dimension CD1. According to some embodiments, the second critical dimension CDT may be 20 nm or less. According to some embodiments, the second critical dimension CDT may be from about 2 nm to about 20 nm.

In the semiconductor device EM2 as described above, the first critical dimension CD1 of the ion-implanted first organic patterns 12*ai*, the second critical dimension CDT of the space patterns 22-1, and the third critical dimension CD3' of the ion-implanted second organic patterns 20*ai*-1 may be different from one another.

According to some embodiments, the second critical dimension CDT of the space patterns 22-1 may be less than the first critical dimension CD1 of the ion-implanted first organic patterns 12*ai*. Also, the third critical dimension CD3' of the ion-implanted second organic patterns 20*ai*-1 may be greater than the first critical dimension CD1 of the ion-implanted first organic patterns 12*ai* and the second critical dimension CDT of the space patterns 22-1.

Figure 17:
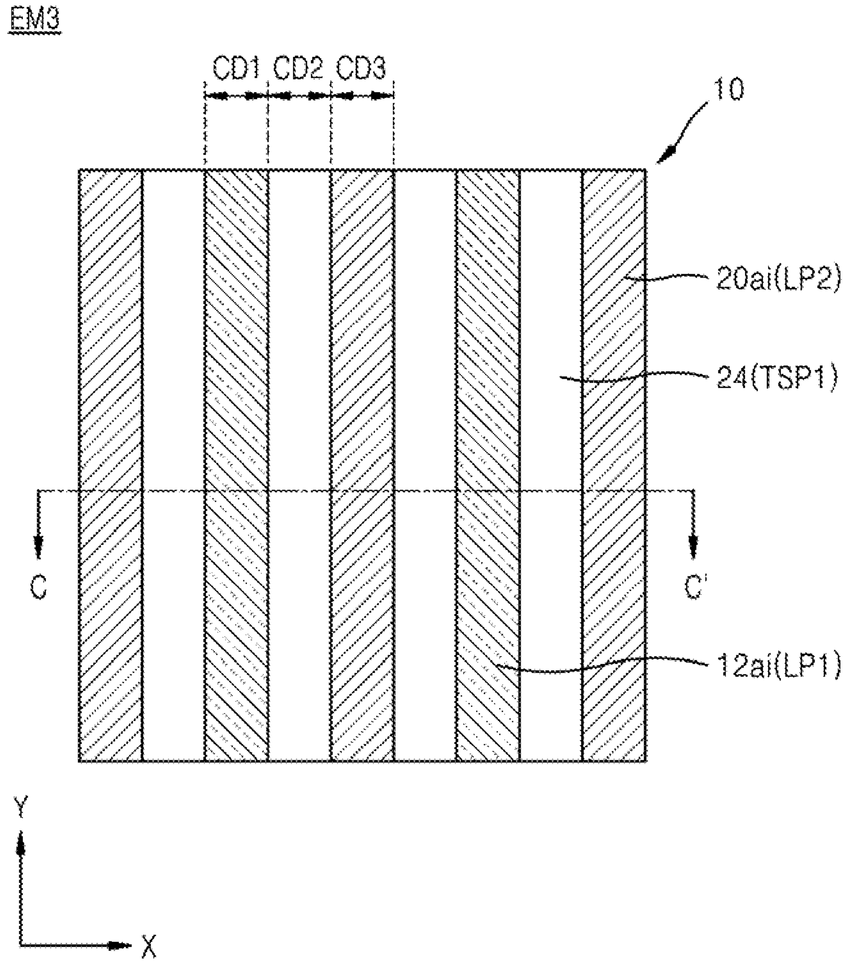
FIG. 17 is a plan view of a semiconductor device according to an example embodiment.
Figure 18:
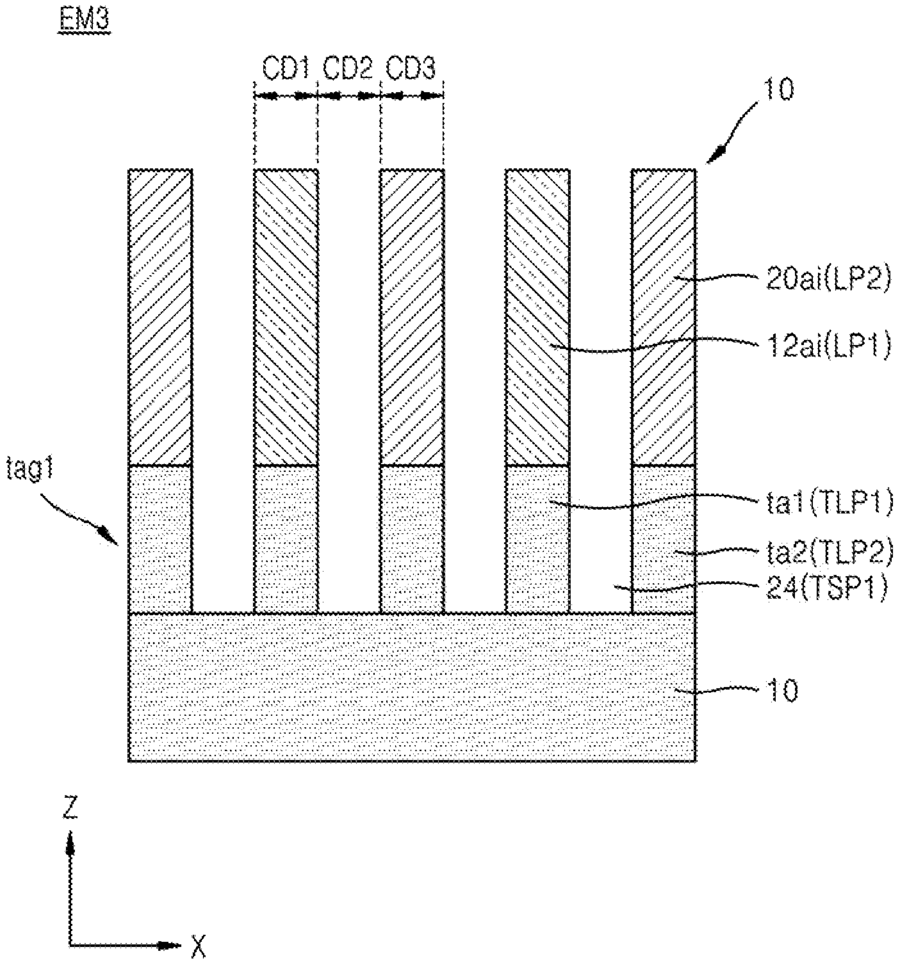
FIG. 18 is a cross-sectional view taken along a line C-C' of FIG. 17.

FIG. 17 is a plan view of a semiconductor device according to an embodiment, and FIG. 18 is a cross-sectional view obtained along a line C-C' of FIG. 17.

A semiconductor device EM3 may be identical to the semiconductor device EM1 of FIGS. 1 and 2 except that trench patterns 24 may be further formed between the ion-implanted first organic patterns 12*ai* and the ion-implanted second organic patterns 20*ai*. In FIGS. 17 and 18, descriptions identical to those given above with reference to FIGS. 1 and 2 are briefly given or omitted.

The semiconductor device EM3 may include the ion-implanted first organic patterns 12*ai*, the ion-implanted second organic patterns 20*ai*, and the trench patterns 24 that may be arranged on the supporting layer 10. The trench patterns 24 may be arranged between the ion-implanted first organic patterns 12*ai* and the ion-implanted second organic patterns 20*ai*. The trench patterns 24 may be a plurality of patterns spaced apart from one another in the first direction (X direction) and extending in the second direction (Y direction) on the supporting layer 10. As shown in FIG. 17, the trench patterns 24 may be linear trench patterns TSP1 in a plan view.

As shown in FIG. 18, the trench patterns 24 may be formed by etching a target layer tag1, which may be a portion of the supporting layer 10, by using the ion-implanted first organic patterns 12*ai* and the ion-implanted second organic patterns 20*ai* as an etching mask. The trench patterns 24 may have the same second critical dimension CD2 as the space patterns 22 of FIGS. 1 and 2.

As the trench patterns 24 are formed, as shown in FIG. 18, the target layer tag1 may include first target support patterns ta1 positioned below the ion-implanted first organic patterns 12*ai* and second target support patterns ta2 positioned below the ion-implanted second organic patterns 20*ai*. The first target support patterns ta1 and the second target support patterns ta2 may include the same material as the supporting layer 10.

The first target support patterns ta1 may be first linear target support patterns TLP1 extending in the second direction (Y direction). The second target support patterns ta2 may be second linear target support patterns TLP2 extending in the second direction (Y direction).

In the semiconductor device EM3 as described above, the trench patterns 24 may be formed by etching the target layer tag1, which is a portion of the supporting layer 10, by using the ion-implanted first organic patterns 12*ai* and the ion-implanted second organic patterns 20*ai*.

Figure 19:
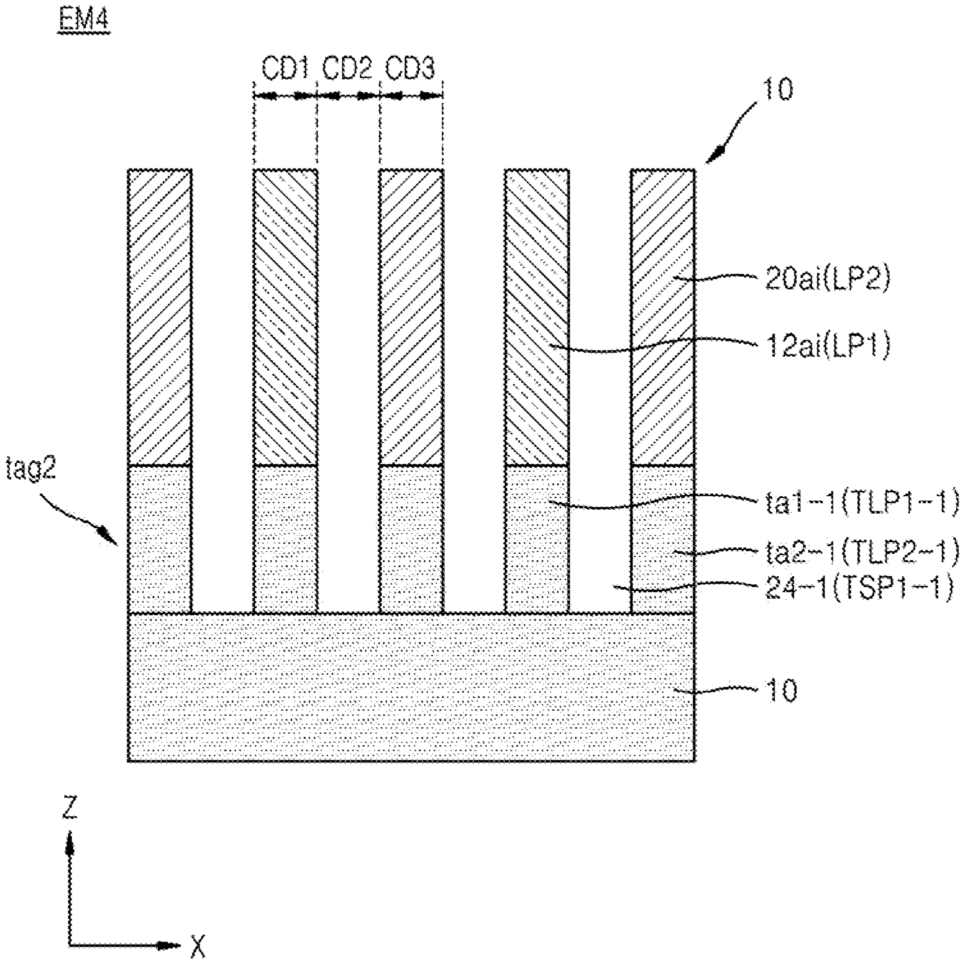
FIG. 19 is a cross-sectional view of a semiconductor device according to an example embodiment.

FIG. 19 is a cross-sectional view of a semiconductor device according to an embodiment.

A semiconductor device EM4 may be identical to the semiconductor device EM3 of FIGS. 17 and 18 except that a target layer tag2 may be positioned on the supporting layer 10. In FIG. 19, descriptions identical to those given above with reference to FIGS. 17 and 18 may be briefly given or omitted.

The semiconductor device EM4 may include the ion-implanted first organic patterns 12*ai*, the ion-implanted second organic patterns 20*ai*, and trench patterns 24-1 that may be arranged on the supporting layer 10. The trench patterns 24-1 may be arranged between the ion-implanted first organic patterns 12*ai* and the ion-implanted second organic patterns 20*ai*. The trench patterns 24-1 may be a plurality of patterns spaced apart from one another in the first direction (X direction) and extending in the second direction (Y direction) on the supporting layer 10. The trench patterns 24-1 may be linear trench patterns TSP1-1 extending in the second direction (Y direction in FIG. 17), similar to the trench patterns 24 of FIG. 17.

The trench patterns 24-1 may be formed by etching the target layer tag2 by using the ion-implanted first organic patterns 12*ai* and the ion-implanted second organic patterns 20*ai* as an etching mask. The target layer tag2 may be an insulation layer or a conductive layer (e.g., a metal layer). The trench patterns 24-1 may have the same second critical dimension CD2 as the space patterns 22 of FIGS. 1 and 2.

As the trench patterns 24-1 are formed, the target layer tag2 may include first target support patterns ta1-1 positioned below the ion-implanted first organic patterns 12*ai* and second target support patterns ta2-1 positioned below the ion-implanted second organic patterns 20*ai*. The first target support patterns ta1-1 and the second target support patterns ta2-1 may include a material different from that constituting the supporting layer 10.

The first target support patterns ta1-1 may be first linear target support patterns TLP1-1 extending in the second direction (Y direction of FIG. 17). The second target support patterns ta2-1 may be second linear target support patterns TLP2-1 extending in the second direction (Y direction of FIG. 17).

In the semiconductor device EM4 as described above, the trench patterns 24-1 may be formed by etching the target layer tag2 by using the ion-implanted first organic patterns 12*ai* and the ion-implanted second organic patterns 20*ai*.

Figure 20:
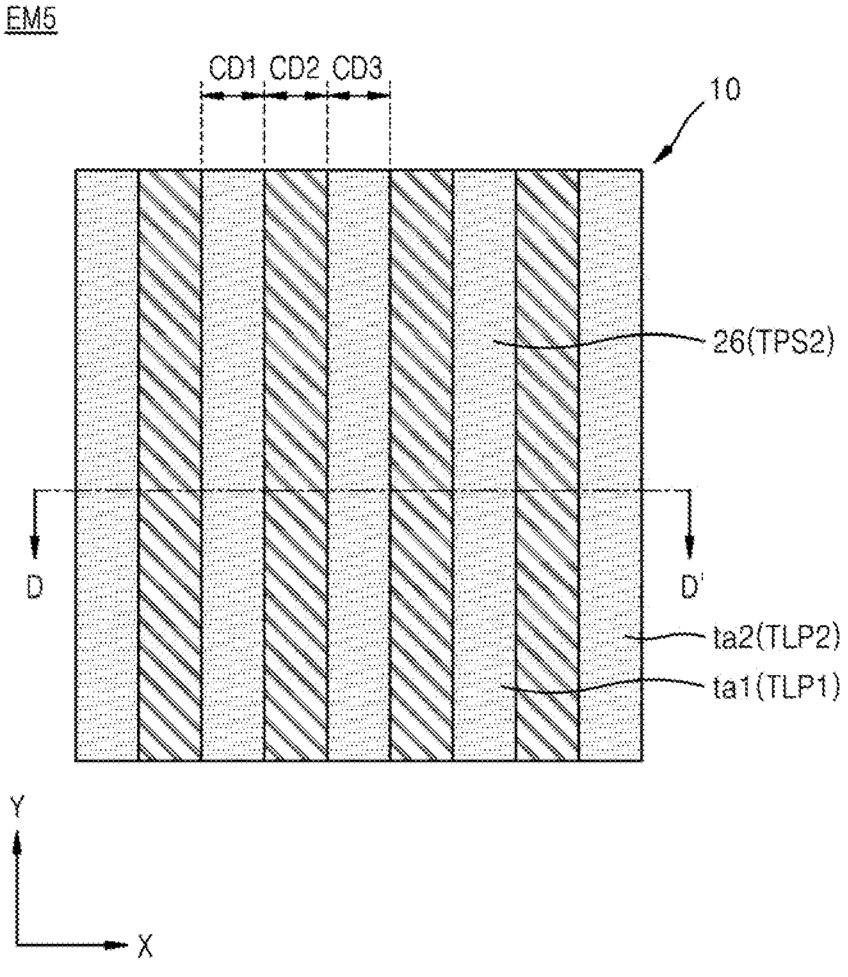
FIG. 20 is a plan view of a semiconductor device according to an example embodiment.
Figure 21:
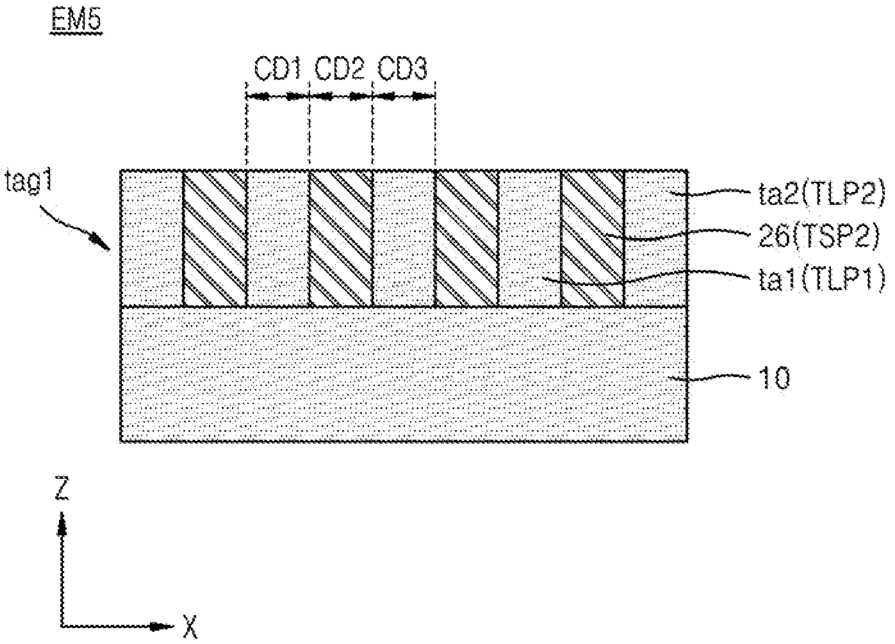
FIG. 21 is a cross-sectional view taken along a line D-D' of FIG. 20.

FIG. 20 is a cross-sectional view of a semiconductor device according to an example embodiment, and FIG. 21 is a cross-sectional view obtained along a line D-D' of FIG. 20.

A semiconductor device EM5 may be identical to the semiconductor device EM1 of FIGS. 1 and 2 except that insulation patterns 26 may be further formed between the ion-implanted first organic patterns 12*ai* and the ion-implanted second organic patterns 20*ai*.

The semiconductor device EM5 may be identical to the semiconductor device EM3 of FIGS. 18 and 19 except that the insulation patterns 26 are further formed between the first target support patterns ta1 and the second target support patterns ta2. In FIGS. 20 and 21, descriptions identical to those given above with reference to FIGS. 1, 2, 18, and 19 will be briefly given or omitted.

The semiconductor device EM5 may include the first target support patterns ta1, the second target support patterns ta2, and insulation patterns 26 arranged on the supporting layer 10. The first target support patterns ta1 may be first linear target support patterns TLP1 extending in the second direction (Y direction). The second target support patterns ta2 may be second linear target support patterns TLP2 extending in the second direction (Y direction).

The insulation patterns 26 may be arranged between the first target support patterns ta1 and the second target support patterns ta2. The insulation patterns 26 may be a plurality of patterns spaced apart from one another in the first direction (X direction) and extending in the second direction (Y direction) on the supporting layer 10. As shown in FIG. 20, the insulation patterns 26 may be linear trench patterns TSP2 in a plan view.

The insulation patterns 26 may be formed by removing the ion-implanted first organic patterns 12*ai* and the ion-implanted second organic patterns 20*ai* of FIG. 18 and then filling the trench patterns 24 with an insulation layer. The insulation patterns 26 may have the same second critical dimension CD2 as the space patterns 22 of FIGS. 1 and 2. According to the formation of the insulation patterns 26, the target layer tag1 may include the first target support patterns ta1 and the second target support patterns ta2. The first target support patterns ta1 and the second target support patterns ta2 may include the same material as the supporting layer 10.

The first target support patterns ta1 may be first linear target support patterns TLP1 extending in the second direction (Y direction). The second target support patterns ta2 may be second linear target support patterns TLP2 extending in the second direction (Y direction). In the semiconductor device EM5 as described above, the insulation patterns 26 may be formed by filling the trench patterns 24 with an insulation layer.

Figure 22:
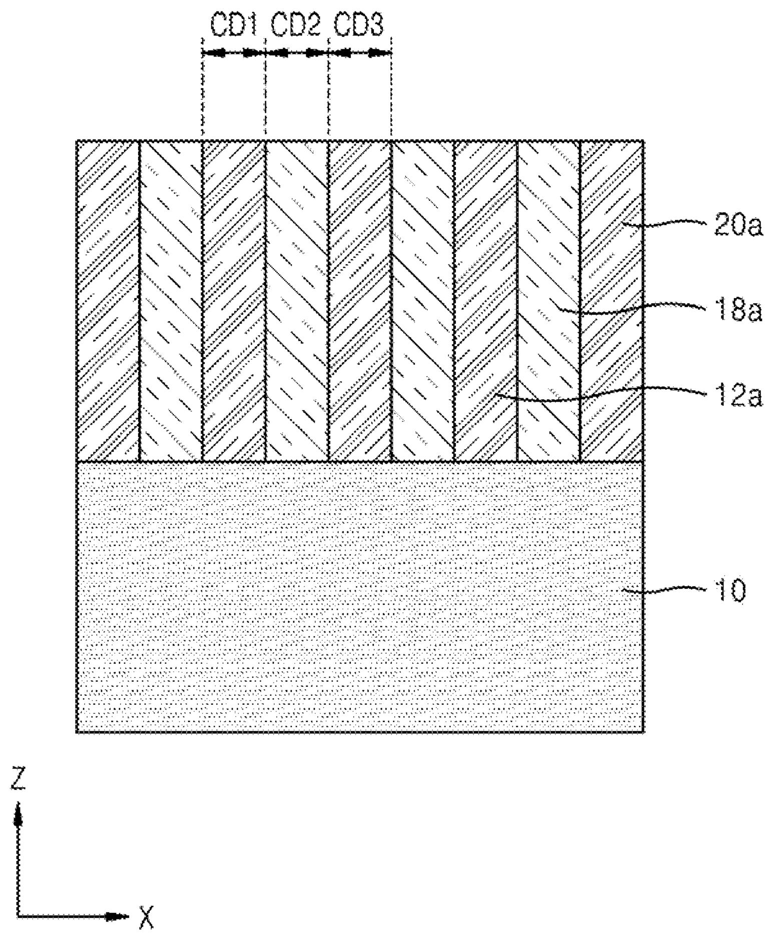
FIGS. 22 to 24 are cross-sectional views for describing a method of manufacturing a semiconductor device according to an example embodiment.
Figure 23:
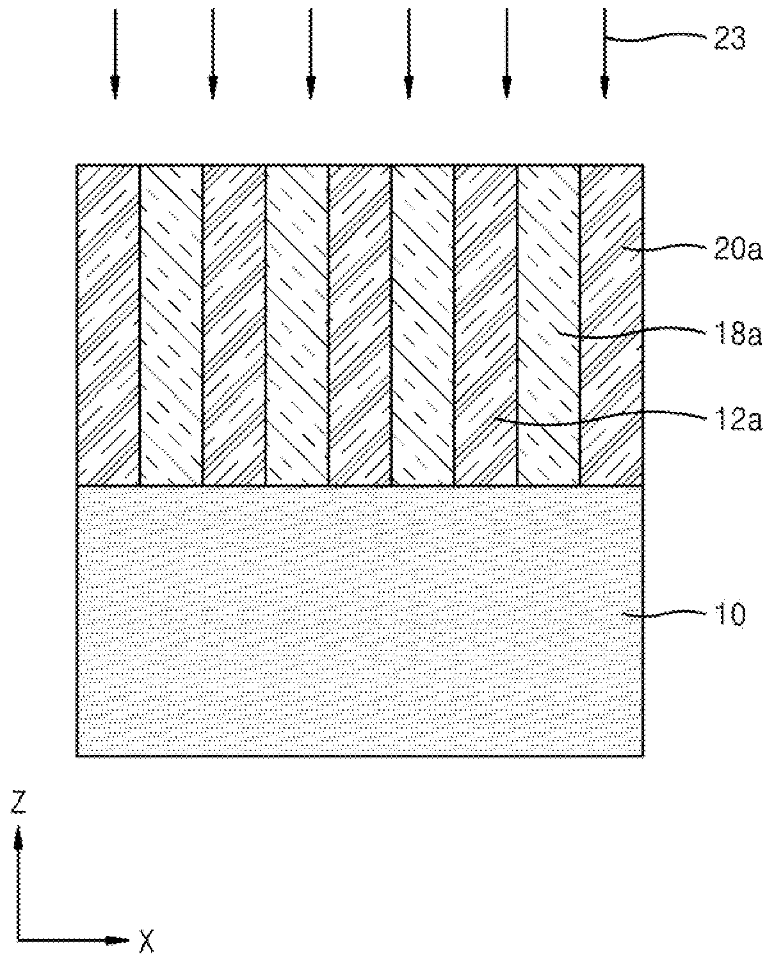
Figure 24:
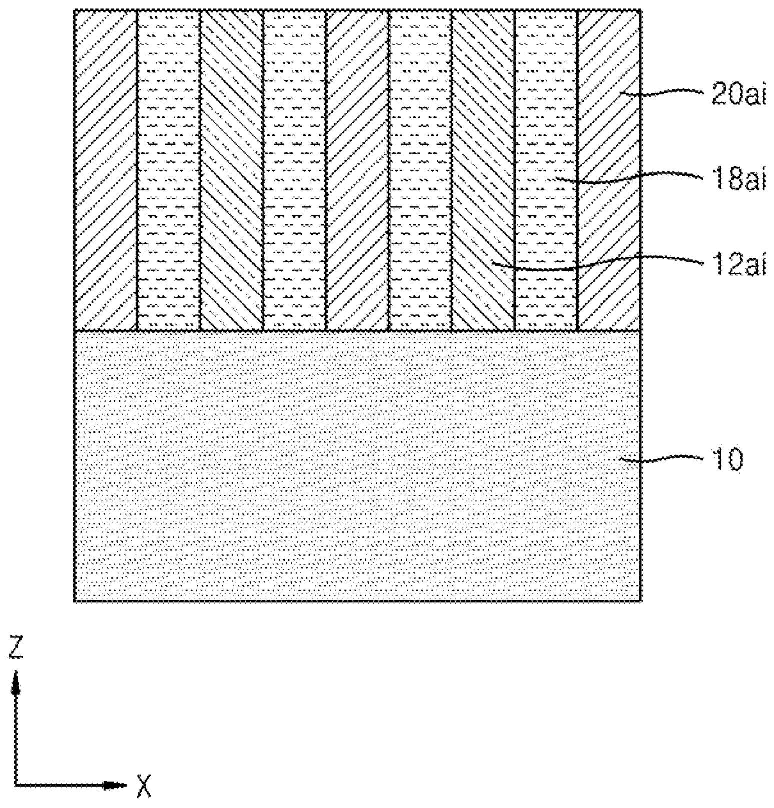

FIGS. 22 to 24 are cross-sectional views for describing a method of manufacturing a semiconductor device according to an example embodiment.

The method of manufacturing a semiconductor device of FIGS. 22 to 24 may be identical to the method of FIGS. 3 to 12 except for a change in the order of an ion implantation operation. In FIGS. 22 to 24, descriptions identical to those given above with reference to FIGS. 3 to 12 are briefly given or omitted.

Referring to FIG. 22, first, after performing manufacturing operations of FIGS. 3 to 8, the second organic layer (20 of FIG. 8) may be etched back. As a result, the first organic patterns 12*a*, the inorganic patterns 18*a*, and second organic patterns 20*a* may be formed on the supporting layer 10.

The inorganic patterns 18*a* may be formed on both sidewalls of the first organic patterns 12*a*. The second organic patterns 20*a* may be formed between the inorganic patterns 18*a*. The first organic patterns 12*a* may have the first critical dimension CD1, the inorganic patterns 18*a* may have the second critical dimension CD2, and the second organic patterns 20*a* may have the third critical dimension CD3.

Referring to FIG. 23, an ion implantation process for implanting ions 23 into the entire top surfaces of the first organic patterns 12*a*, the inorganic patterns 18*a*, and the second organic patterns 20*a* may be performed. The ion implantation process may be referred to as an ion doping process. The ions 23 may be inactive ions, e.g., argon ions (Ar+). The ions 23 may be implanted into all of the first organic patterns 12*a*, the inorganic patterns 18*a*, and the second organic patterns 20*a*.

According to some embodiments, the ions 23, i.e., argon ions, may be implanted into all of the first organic patterns 12*a*, the inorganic patterns 18*a*, and the second organic patterns 20*a* at a dose amount of about 1E16 ions/cm$^2$ and an energy from about 10 keV to about 500 keV.

Referring to FIG. 24, the first organic patterns 12*a*, the inorganic patterns 18*a*, and the second organic patterns 20*a* may become the ion-implanted first organic patterns 12*ai*, the ion-implanted inorganic patterns 18*ai*, and the ion-implanted second organic patterns 20*ai*, respectively.

The ion-implanted first organic patterns 12*ai* may have the first critical dimension CD1. The ion-implanted inorganic patterns 18*ai* may have the second critical dimension CD2. The ion-implanted second organic patterns 20*ai* may have the third critical dimension CD3.

Subsequently, as shown in FIG. 12, the ion-implanted inorganic patterns 18*ai* may be selectively etched and removed by using the etch selectivity between patterns on the supporting layer 10. As a result, the plurality of space patterns 22 may remain between the ion-implanted first organic patterns 12*ai* and the ion-implanted second organic patterns 20*ai* on the supporting layer 10.

FIGS. 25 to 29 are cross-sectional views for describing a method of manufacturing a semiconductor device according to an example embodiment.

The method of manufacturing a semiconductor device of FIGS. 25 to 29 may be identical to the method of FIGS. 3 to 12 except that the first organic layer (12 of FIG. 3) and the second organic layer 20 may include different materials and the order of an operation of etching back the inorganic layer 18 may be changed. In FIGS. 25 to 29, descriptions identical to those given above with reference to FIGS. 3 to 12 are briefly given or omitted.

Figure 25:
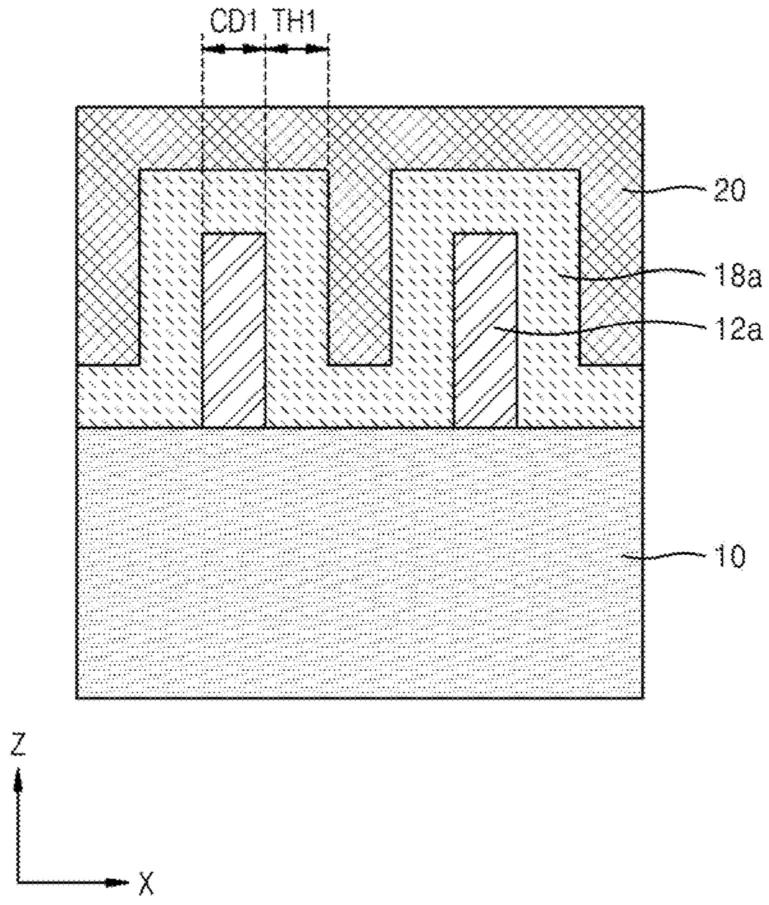
FIGS. 25 to 29 are cross-sectional views for describing a method of manufacturing a semiconductor device according to an example embodiment.

Referring to FIG. 25, first, manufacturing operations of FIGS. 3 to 6 may be performed. In the manufacturing operations of FIGS. 3 to 6, the first organic layer (12 of FIG. 3) may be formed using an SOH material, an ACL material, or a photoresist material. In the present embodiment, the first organic layer (12 in FIG. 3) may include an SOH material. Through the manufacturing operations of FIGS. 3 to 6, the first organic patterns 12*a* may have the first critical dimension CD1, and the inorganic layer 18 having the first thickness TH1 may be formed on the first organic patterns 12*a*.

Next, the second organic layer 20 may be formed on the supporting layer 10 to cover the first organic patterns 12*a* and the inorganic layer 18 and fill the space between the first organic patterns 12*a*. The second organic layer 20 may be formed on the inorganic layer 18 to fill the space between the first organic patterns 12*a*. The second organic layer 20 may include a material different from that constituting the first organic layer (12 of FIG. 3) or the first organic patterns 12*a*.

The second organic layer 20 may be formed using an SOH material, an ACL material, or a photoresist material. In the present embodiment, the second organic layer 20 may include an ACL material.

Figure 26:
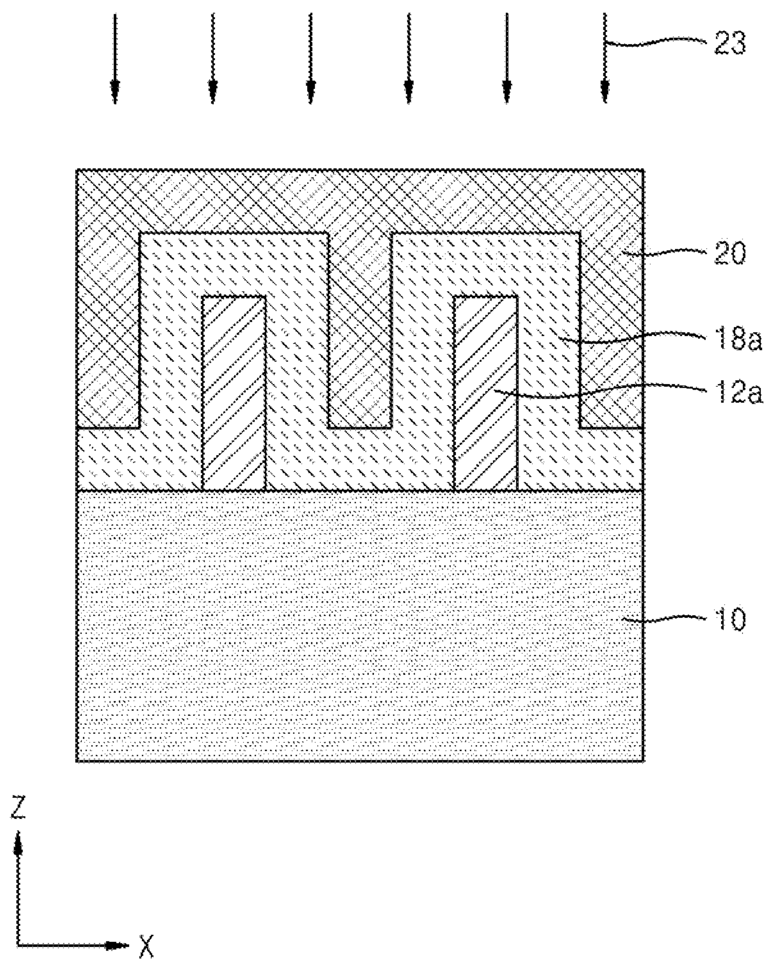
Figure 27:
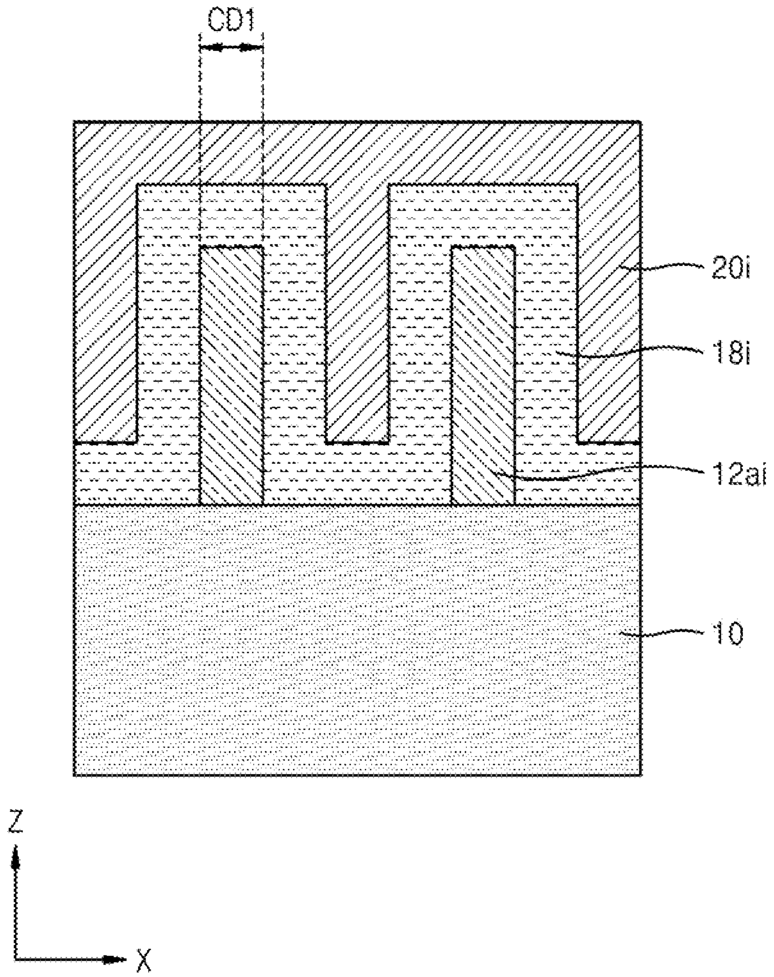

Referring to FIGS. 26 and 27, as shown in FIG. 26, an ion implantation process of implanting ions 23 into the entire top surface of the second organic layer 20 may be performed. The ion implantation process may be referred to as an ion doping process. The ions 23 may be inactive ions, e.g., argon ions (Ar+). The ions 23 may be implanted into all of the second organic layer 20, the first organic patterns 12*a*, and the inorganic patterns 18*a*.

According to some embodiments, the ions 23, i.e., argon ions, may be implanted into all of the second organic layer 20, the first organic patterns 12*a*, and the inorganic patterns 18*a* at a dose amount of about 1E16 ions/cm$^2$ and an energy from about 10 keV to about 500 keV.

As shown in FIG. 27, as the ions 23 are implanted, the second organic layer 20, the first organic patterns 12*a*, and the inorganic layer 18 may become an ion-implanted second organic layer 20*i*, the ion-implanted first organic patterns 12*ai*, and an ion-implanted inorganic layer 18*i*, respectively. The ion-implanted first organic patterns 12*ai* may have the first critical dimension CD1.

As described below, the ion-implanted second organic layer 20*i* and the ion-implanted first organic patterns 12*ai* may exhibit reduced etching rates with respect to an etching gas, whereas the ion-implanted inorganic layer 18*i* may exhibit an increased etching rate with respect to the etching gas.

Figure 28:
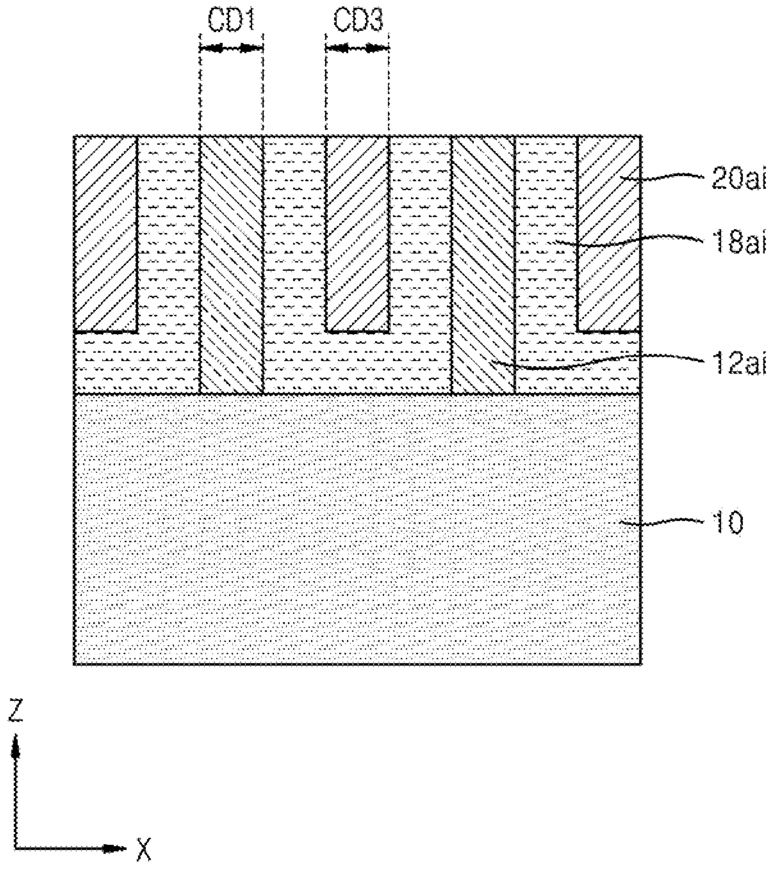

Referring to FIG. 28, the plurality of ion-implanted second organic patterns 20*ai* may be formed by etching back the ion-implanted second organic layer 20*i*. The plurality of ion-implanted inorganic patterns 18*ai* may be formed by etching back the ion-implanted inorganic layer 18*i*.

The ion-implanted second organic patterns 20*ai* may have the second critical dimension CD2. The ion-implanted second organic patterns 20*ai* may be positioned between the ion-implanted inorganic patterns 18*ai*. The ion-implanted inorganic patterns 18*ai* may be positioned between the ion-implanted first organic patterns 12*ai* and the ion-implanted second organic patterns 20*ai*.

Figure 29:
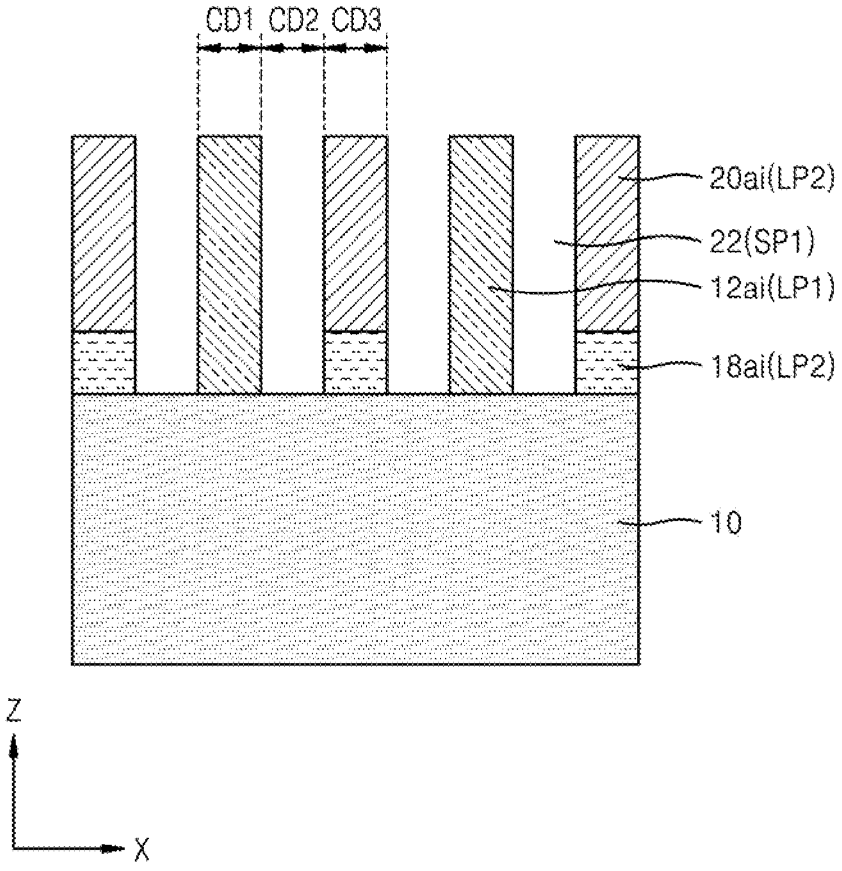

Referring to FIG. 29, the ion-implanted inorganic patterns 18*ai* positioned between the ion-implanted first organic patterns 12*ai* and the ion-implanted second organic patterns 20*ai* on the supporting layer 10 may be selectively removed. The ion-implanted inorganic patterns 18*ai* positioned between the ion-implanted first organic patterns 12*ai* and the ion-implanted second organic patterns 20*ai* may be selectively removed by using a dry etching method, e.g., a plasma etching method. The ion-implanted inorganic patterns 18*ai* positioned between the ion-implanted first organic patterns 12*ai* and the ion-implanted second organic patterns 20*ai* may be etched by using an etching gas, e.g., $CF_4/H_2$ gas, $CHF_3$ gas, or $C_2F_6$ gas.

The plurality of space patterns 22 may be formed between the ion-implanted first organic patterns 12*ai* and the ion-implanted second organic patterns 20*ai* by etching the ion-implanted inorganic patterns 18*ai* positioned between the ion-implanted first organic patterns 12*ai* and the ion-implanted second organic patterns 20*ai*. Ion-implanted inorganic patterns 18*bi* may be positioned below the ion-implanted second organic patterns 20*ai*.

The space patterns 22 may be linear space patterns SP1 as described above in FIG. 12. The space patterns 22 may have the second critical dimension CD2. The ion-implanted first organic patterns 12*ai* may become the first linear patterns LP1. The ion-implanted second organic patterns 20*ai* and the ion-implanted inorganic patterns 18*bi* may become the second linear patterns LP2. The ion-implanted second organic patterns 20*ai* may have the third critical dimension CD3.

According to the method of manufacturing a semiconductor device as described above, even when the first organic layer 12 and the second organic layer 20 include different materials and the order of an operation of etching back the inorganic layer 18 is changed, the ion-implanted first organic patterns 12*ai*, the ion-implanted second organic patterns 20*ai*, and the space patterns 22 may be easily formed on the supporting layer 10.

Figure 30:
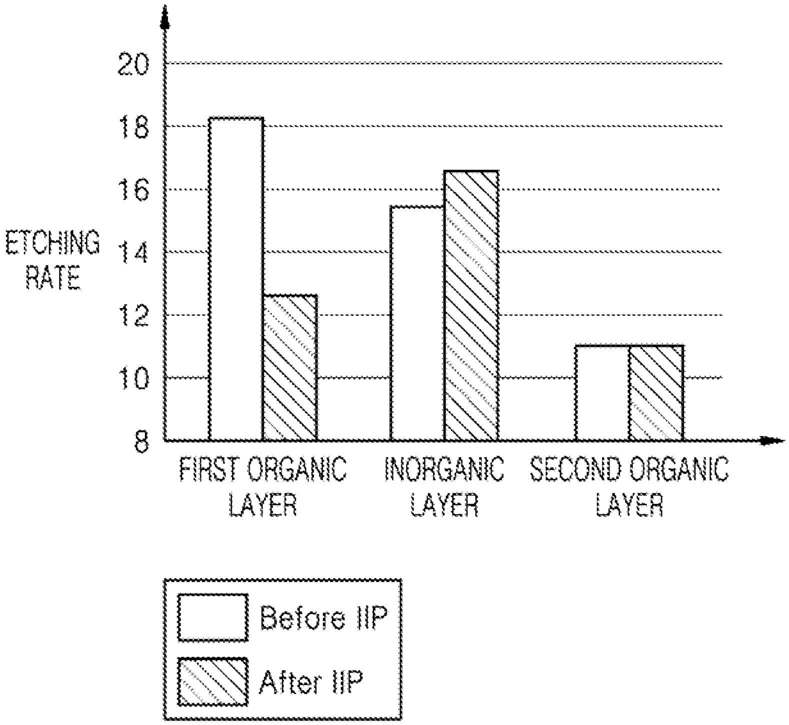
FIG. 30 is a diagram showing changes in etching rates of a first organic layer, a second organic layer, and an inorganic layer before and after ion implantation according to an example embodiment.

FIG. 30 is a diagram showing changes in etching rates of a first organic layer, a second organic layer, and an inorganic layer before and after ion implantation according to an example embodiment.

The bar graph on the left of FIG. 30 shows changes in etching rates of first organic layers (the first organic layer 12 of FIG. 3 and the first organic layer 12 of FIG. 25) before ion implantation and etching rates of the first organic layers (the ion-implanted first organic patterns 12*ai* of FIGS. 27 to 29) after ion implantation. The etching rate may indicate an etch thickness (A) per second (sec). The etching rate may relate to an etching gas for etching the ion-implanted inorganic patterns 18*ai* described above. As shown in the bar graph on the left of FIG. 30, the etching rate of the first organic layer (the ion-implanted first organic patterns 12*ai* of FIGS. 27 to 29) may be less than that of the first organic layers (the first organic layer 12 of FIG. 3 and the first organic layer 12 of FIG. 25).

The bar graph at the middle of FIG. 30 shows changes in the etching rate of an inorganic layer (the inorganic layer 18 of FIG. 15) before ion implantation and etching rates of inorganic layers (the ion-implanted inorganic layer 18*i* of FIG. 27 and the ion-implanted inorganic patterns 18*ai* of FIG. 28) after ion implantation. The etching rate may relate to an etching gas for etching the ion-implanted inorganic patterns 18*ai* described above. As shown in the bar graph in the middle of FIG. 30, the etching rate of the inorganic layers (the ion-implanted inorganic layer 18*i* of FIG. 27 and the ion-implanted inorganic patterns 18*ai* of FIG. 28) after ion implantation may be greater than that of the inorganic layer (the inorganic layer 18 of FIG. 15) before ion implantation.

The bar graph on the right of FIG. 30 shows changes in the etching rate of a second organic layer (the second organic layer 20 of FIG. 25) before ion implantation and the etching rate of a second organic layers (the ion-implanted second organic patterns 20*ai* of FIGS. 27 to 29) after ion implantation. The etching rate may relate to an etching gas for etching the ion-implanted inorganic patterns 18*ai* described above. As shown in the bar graph on the right of FIG. 30, the etching rate of the second organic layer (the ion-implanted second organic patterns 20*ai* of FIGS. 27 to 29) may be identical to that of the second organic layer (the second organic layer 20 of FIG. 25) before ion implantation.

As shown in FIG. 30, the etching rate of the first organic layer after ion implantation (the ion-implanted first organic patterns 12*ai* of FIGS. 27 to 29) and the second organic layer (the ion-implanted second organic patterns 20*ai* of FIGS. 27 to 29) after ion implantation may be less than that of the inorganic layer (the ion-implanted inorganic layer 18*i* of FIG. 27 and the ion-implanted inorganic patterns 18*ai* of FIG. 28) after ion implantation. Therefore, as described above with reference to FIGS. 28 and 29, the ion-implanted inorganic patterns 18*ai* of FIG. 28 may be selectively and easily etched and removed without damaging the ion-implanted second organic patterns 20*ai* and the ion-implanted first organic patterns 12*ai*.

By way of summation and review, a process of finely forming patterns on a semiconductor substrate, e.g., a double patterning process, has been proposed. It is demanded for the double patterning process to reliably form patterns on a semiconductor substrate. A method of manufacturing a semiconductor device including a double patterning process capable of reliably forming patterns is disclosed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, comprising:

forming a plurality of first organic patterns spaced apart from one another in one direction on a supporting layer, wherein the plurality of first organic patterns include ion-implanted first organic patterns;

forming a plurality of inorganic patterns on the supporting layer that are in contact with the plurality of first organic patterns and spaced apart from one other in the one direction, wherein the plurality of inorganic patterns include ion-implanted inorganic patterns;

forming a plurality of second organic patterns arranged between the plurality of inorganic patterns on the supporting layer, wherein the plurality of second organic patterns include ion-implanted second organic patterns; and selectively etching the ion-implanted inorganic patterns to form a plurality of space patterns that are arranged between the ion-implanted first organic patterns and the ion-implanted second organic patterns.

2. The method as claimed in claim 1, wherein the plurality of first organic patterns and the plurality of second organic patterns include a same material.

3. The method as claimed in claim 1, wherein an etching rate of the plurality of inorganic patterns is greater than etching rates of the plurality of first organic patterns and the plurality of second organic patterns.

4. The method as claimed in claim 1, wherein an etching rate of the plurality of inorganic patterns is greater than an etching rate of the supporting layer.

5. The method as claimed in claim 1, wherein the plurality of first organic patterns and the plurality of second organic patterns include different materials.

6. The method as claimed in claim 1, wherein:

the plurality of first organic patterns have a first critical dimension, the plurality of space patterns have a second critical dimension, the plurality of second organic patterns have a third critical dimension, and the first critical dimension, the second critical dimension, and the third critical dimension are the same.

7. The method as claimed in claim 1, wherein:

the plurality of first organic patterns have a first critical dimension, the plurality of space patterns have a second critical dimension, the plurality of second organic patterns have a third critical dimension, and the first critical dimension, the second critical dimension, and the third critical dimension are different from one another.

8. The method as claimed in claim 1, wherein:

the plurality of first organic patterns have a first critical dimension, the plurality of space patterns have a second critical dimension, the plurality of second organic patterns have a third critical dimension, the second critical dimension is less than the first critical dimension, and the third critical dimension is greater than the first critical dimension.

9. The method as claimed in claim 1, wherein the supporting layer includes a semiconductor substrate, and wherein the method further comprises forming a plurality of trench patterns in the semiconductor substrate by etching the semiconductor substrate by using the plurality of first organic patterns and the plurality of second organic patterns as an etching mask; and further forming insulation patterns within the plurality of trench patterns.

10. The method as claimed in claim 1, wherein the supporting layer is a semiconductor substrate, and wherein the method further comprises:

forming a target layer on the semiconductor substrate; and further forming a plurality of trench patterns in the target layer by etching the target layer by using the plurality of first organic patterns and the plurality of second organic patterns as an etching mask.

11. The method as claimed in claim 1, wherein the plurality of first organic patterns and the plurality of second organic patterns include carbon-containing material layers, and the plurality of inorganic patterns include oxide layers.

12. A method of manufacturing a semiconductor device, comprising:

forming a plurality of first organic patterns spaced apart from one another in one direction on a supporting layer;

forming a plurality of inorganic patterns on both sidewalls of the plurality of first organic patterns;

forming a second organic layer between the plurality of inorganic patterns while covering the plurality of first organic patterns and the plurality of inorganic patterns;

implanting ions into all of the second organic layer, the plurality of first organic patterns, and the plurality of inorganic patterns;

forming ion-implanted second organic patterns, ion-implanted first organic patterns, and ion-implanted inorganic patterns by etching back the ion-implanted second organic layer, wherein the ion-implanted inorganic patterns are in contact with the ion-implanted first organic patterns and apart from one another in the one direction and the ion-implanted second organic patterns are arranged between the ion-implanted inorganic patterns; and selectively etching the ion-implanted inorganic patterns to form a plurality of space patterns that are arranged between the ion-implanted first organic patterns and the ion-implanted second organic patterns.

13. The method as claimed in claim 12, wherein the forming of the plurality of first organic patterns includes:

forming a first organic layer on the supporting layer; and patterning the first organic layer through a photolithography process.

14. The method as claimed in claim 12, wherein the forming of the plurality of inorganic patterns includes:

forming an inorganic layer covering the plurality of first organic patterns on the supporting layer; and etching back the inorganic layer.

15. The method as claimed in claim 12, wherein:

an etching rate of the ion-implanted inorganic patterns is greater than an etching rate of the plurality of inorganic patterns that are not ion-implanted, and etching rates of the ion-implanted first organic patterns and the ion-implanted second organic patterns are less than or equal to etching rates of the plurality of first organic patterns and the second organic layer that are not ion-implanted.

16. The method as claimed in claim 12, wherein the plurality of first organic patterns and the second organic layer include different materials.

17. The method as claimed in claim 12, wherein:

the plurality of first organic patterns have a first critical dimension, the plurality of space patterns have a second critical dimension, the second organic layer has a third critical dimension, and the first critical dimension, the second critical dimension, and the third critical dimension are different from one another.

* * * * *